United States Patent
Sung et al.

(10) Patent No.: US 11,742,288 B2
(45) Date of Patent: Aug. 29, 2023

(54) THREE-DIMENSIONAL MEMORY DEVICE AND MANUFACTURING METHOD THEREOF

(71) Applicant: SK hynix Inc., Icheon-si (KR)

(72) Inventors: Sang Hyun Sung, Icheon-si (KR); Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 127 days.

(21) Appl. No.: 17/242,224

(22) Filed: Apr. 27, 2021

(65) Prior Publication Data

US 2022/0189875 A1    Jun. 16, 2022

(30) Foreign Application Priority Data

Dec. 11, 2020 (KR) ........................ 10-2020-0173011

(51) Int. Cl.
| | | |
|---|---|---|
| H01L 23/528 | (2006.01) | |
| H01L 23/522 | (2006.01) | |
| H01L 21/768 | (2006.01) | |
| H10B 41/27 | (2023.01) | |
| H10B 43/27 | (2023.01) | |

(52) U.S. Cl.
CPC .... H01L 23/5283 (2013.01); H01L 21/76816 (2013.01); H01L 21/76877 (2013.01); H01L 23/5226 (2013.01); H10B 41/27 (2023.02); H10B 43/27 (2023.02)

(58) Field of Classification Search
None
See application file for complete search history.

(56) References Cited

U.S. PATENT DOCUMENTS

| | | | |
|---|---|---|---|
| 2020/0251491 A1* | 8/2020 | Ozawa | H01L 23/528 |
| 2022/0020764 A1* | 1/2022 | Oh | H01L 27/11556 |

FOREIGN PATENT DOCUMENTS

| | | |
|---|---|---|
| KR | 10-2017-0124378 A | 11/2017 |
| KR | 10-1843850 A | 3/2018 |
| KR | 10-2020-0088988 A | 7/2020 |
| KR | 10-2022-0083115 A | 6/2022 |

* cited by examiner

Primary Examiner — Hsien Ming Lee

(57) ABSTRACT

A three-dimensional memory device includes a plurality of electrode stacks stacked on a substrate in a vertical direction, each of the plurality of electrode stacks including a plurality of interlayer dielectric layers alternately stacked in the vertical direction with a plurality of electrode layers; and a plurality of staircase structures defined in the plurality of electrode stacks, each of the plurality of staircase structures configured by pad regions of electrode layers in an electrode stack that are disposed in a staircase shape, a staircase structure of an electrode stack lower in the plurality of electrode stacks has a larger width than a staircase structure of an electrode stack that is higher in the plurality of electrode stacks.

10 Claims, 24 Drawing Sheets

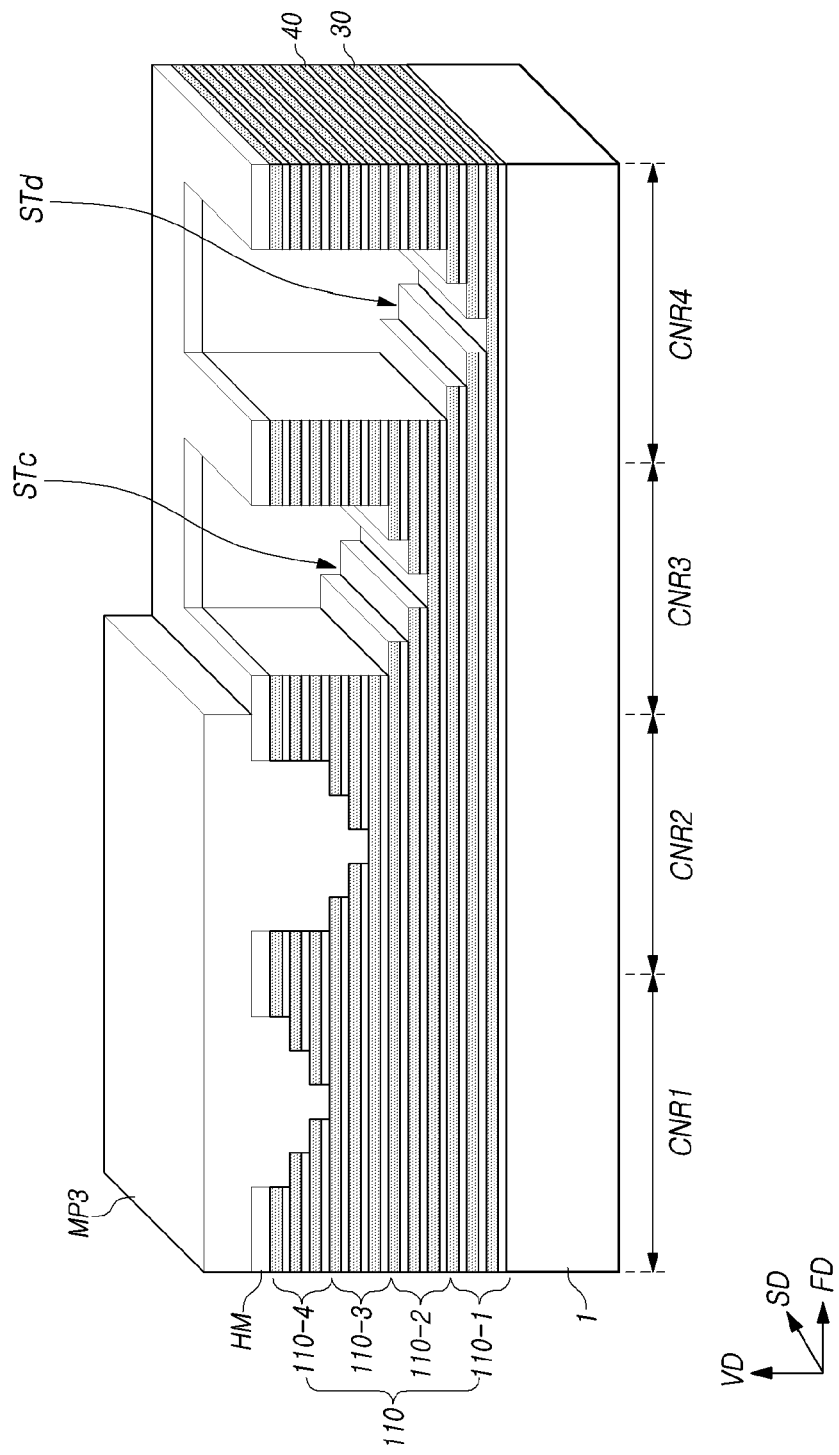

FIG.7
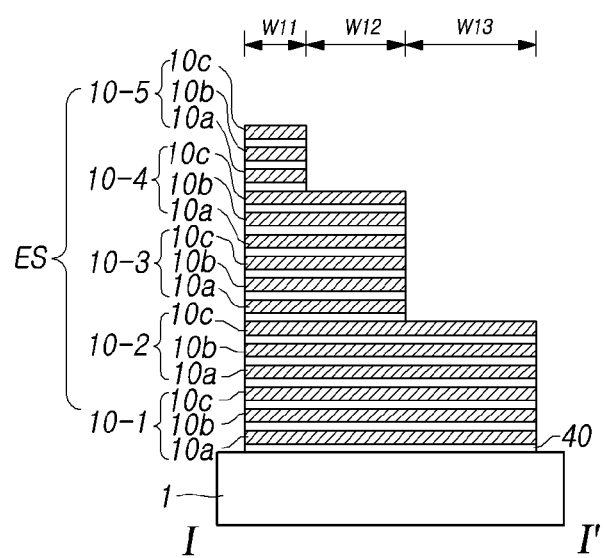
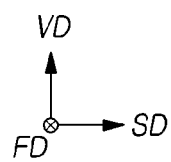

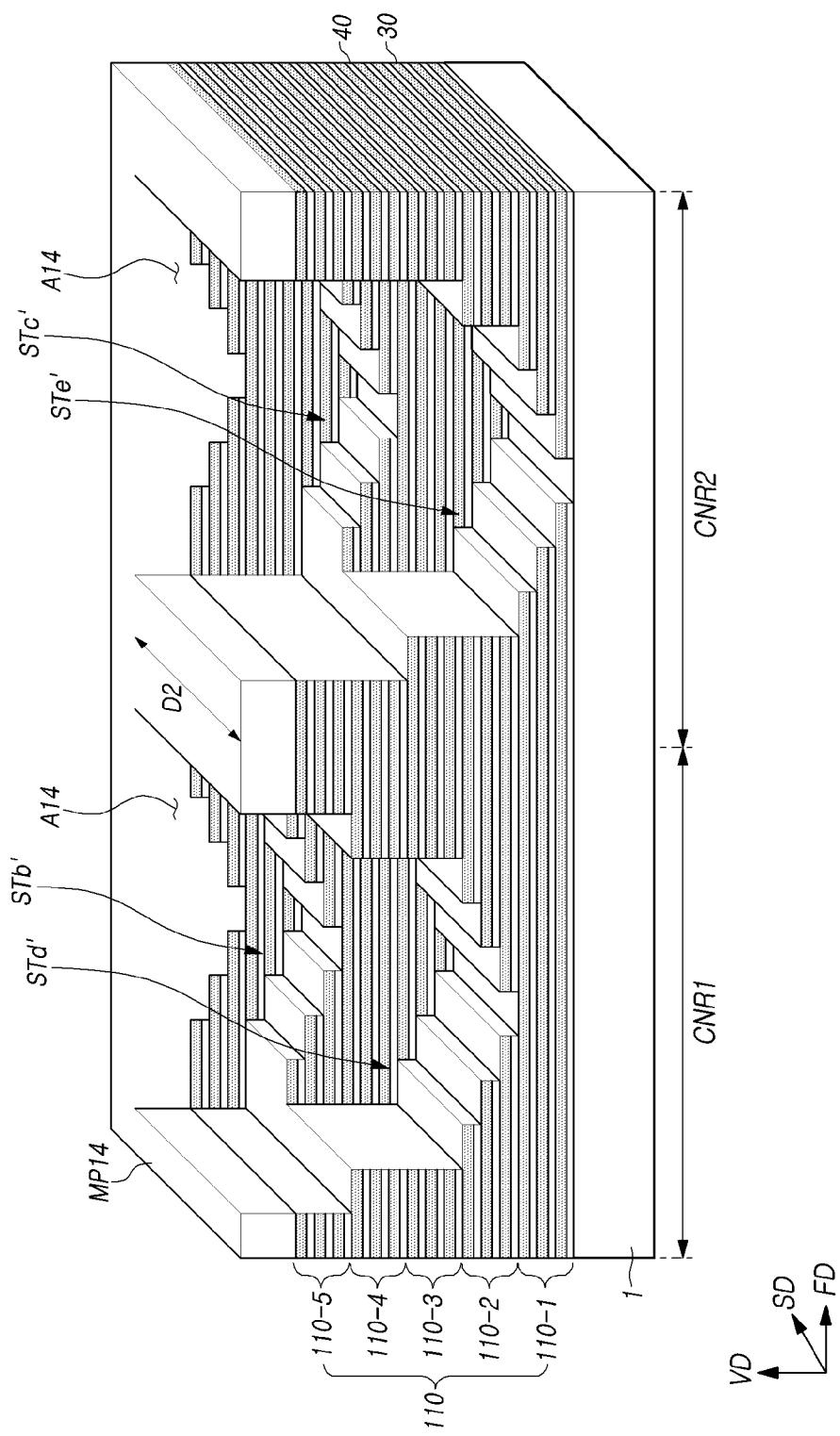

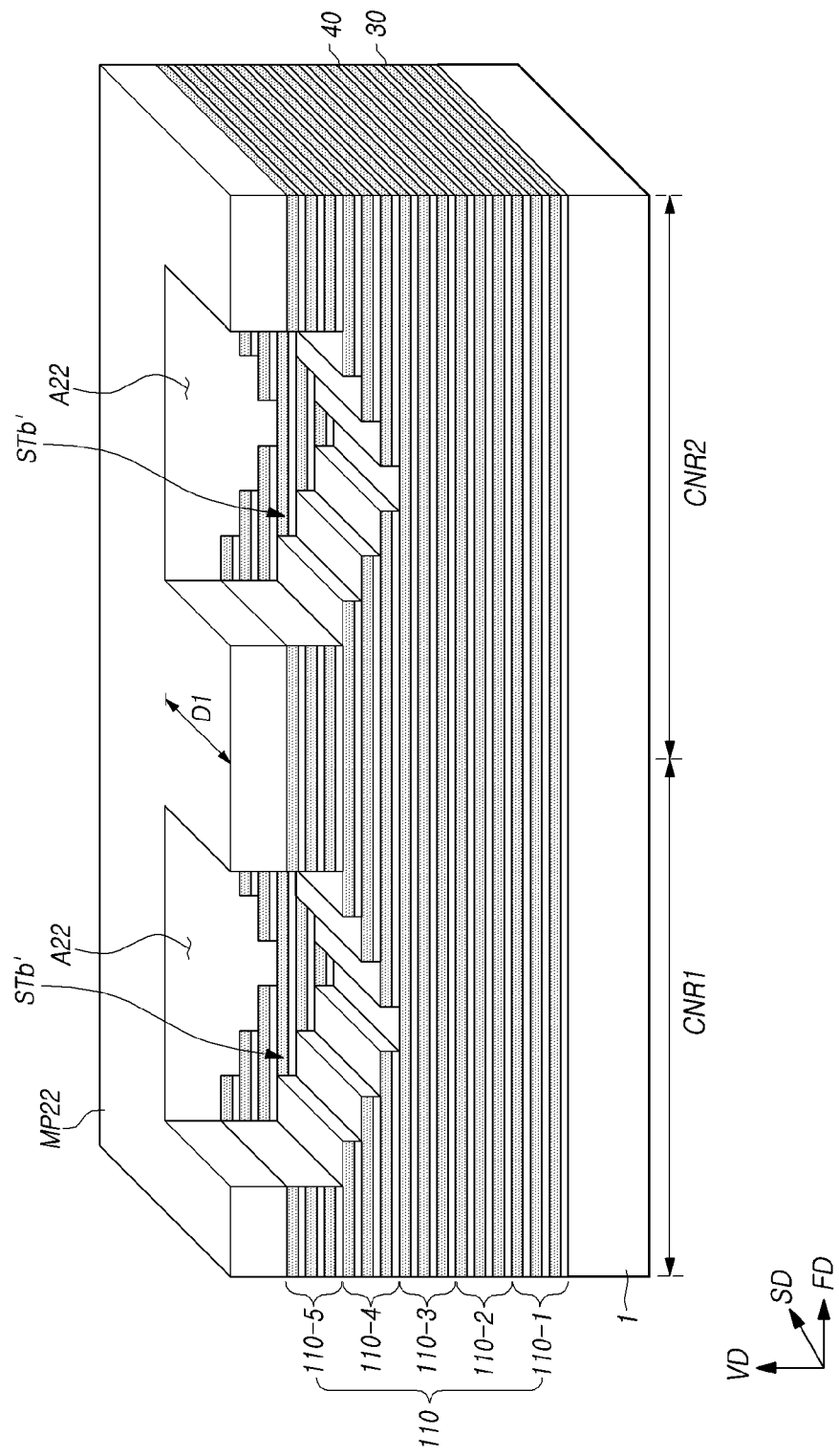

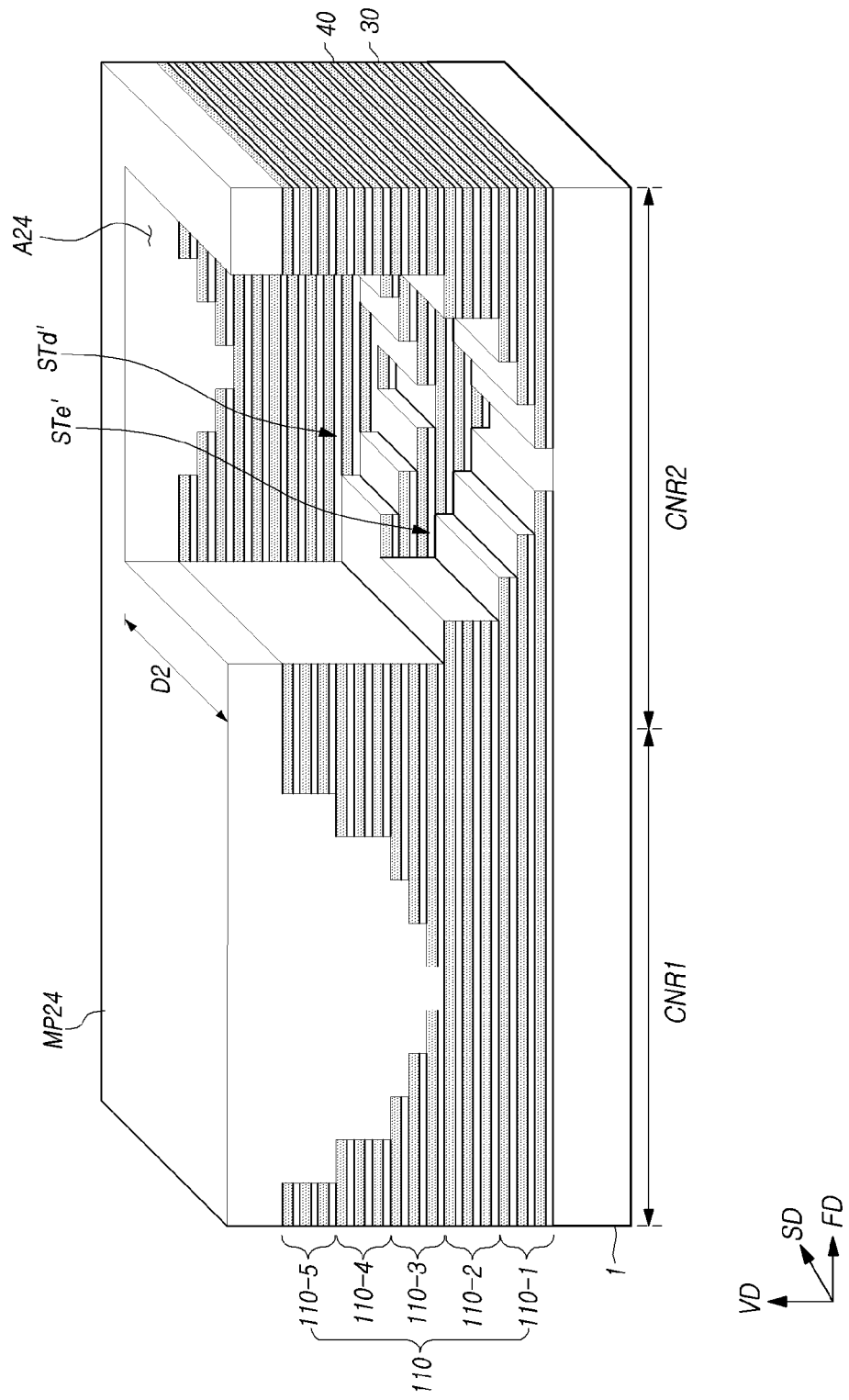

THREE-DIMENSIONAL MEMORY DEVICE AND MANUFACTURING METHOD THEREOF

CROSS-REFERENCE TO RELATED APPLICATION

The present application claims priority under 35 U.S.C. § 119(a) to Korean Patent Application No. 10-2020-0173011 filed in the Korean Intellectual Property Office on Dec. 11, 2020, which is incorporated herein by reference in its entirety.

BACKGROUND

1. Technical Field

Various embodiments generally relate to a semiconductor technology, and particularly, to a three-dimensional memory device and a manufacturing method thereof.

2. Related Art

A three-dimensional memory device has advantages in that a larger capacity may be realized within the same area by increasing the number of stacks through stacking memory cells in a vertical direction, thereby providing high performance and excellent power efficiency.

The three-dimensional memory device includes a plurality of electrode layers, which are coupled to memory cells and are disposed at different heights. In order to independently apply electrical signals to the electrode layers disposed at different heights, a contact should be coupled to each of the electrode layers, and to this end, various technologies are being developed.

SUMMARY

Various embodiments are directed to a three-dimensional memory device that reduces a contact coupling failure and a manufacturing method thereof.

In an embodiment, a three-dimensional memory device may include: a plurality of electrode stacks stacked on a substrate in a vertical direction, each of the plurality of electrode stacks including a plurality of interlayer dielectric layers alternately stacked in the vertical direction with a plurality of electrode layers; and a plurality of staircase structures defined in the plurality of electrode stacks, each of the plurality of staircase structures configured by pad regions of electrode layers in an electrode stack that are disposed in a staircase shape, a staircase structure of an electrode stack lower in the plurality of electrode stacks has a larger width than a staircase structure of an electrode stack that is higher in the plurality of electrode stacks.

In an embodiment, a method for manufacturing a three-dimensional memory device may include: forming a multi-layered stack by stacking, in a vertical direction on a substrate, a plurality of thin film stacks each including a plurality of first material layers that are alternately stacked with a plurality of second material layers; and forming a plurality of staircase structures in the plurality of thin film stacks such that a staircase structure of an upper thin film stack has a smaller width than a staircase structure of a lower thin film stack.

BRIEF DESCRIPTION OF THE DRAWINGS

FIGS. 5A to 5E are perspective views illustrating, by process steps, a three-dimensional memory device in accordance with an embodiment of the disclosure.

FIG. 7 is a sectional view taken along line I-I' of FIG. 6.

FIGS. 10A to 10E are perspective views illustrating, by process steps, the three-dimensional memory device in accordance with the yet another embodiment of the disclosure.

DETAILED DESCRIPTION

Figure 1:
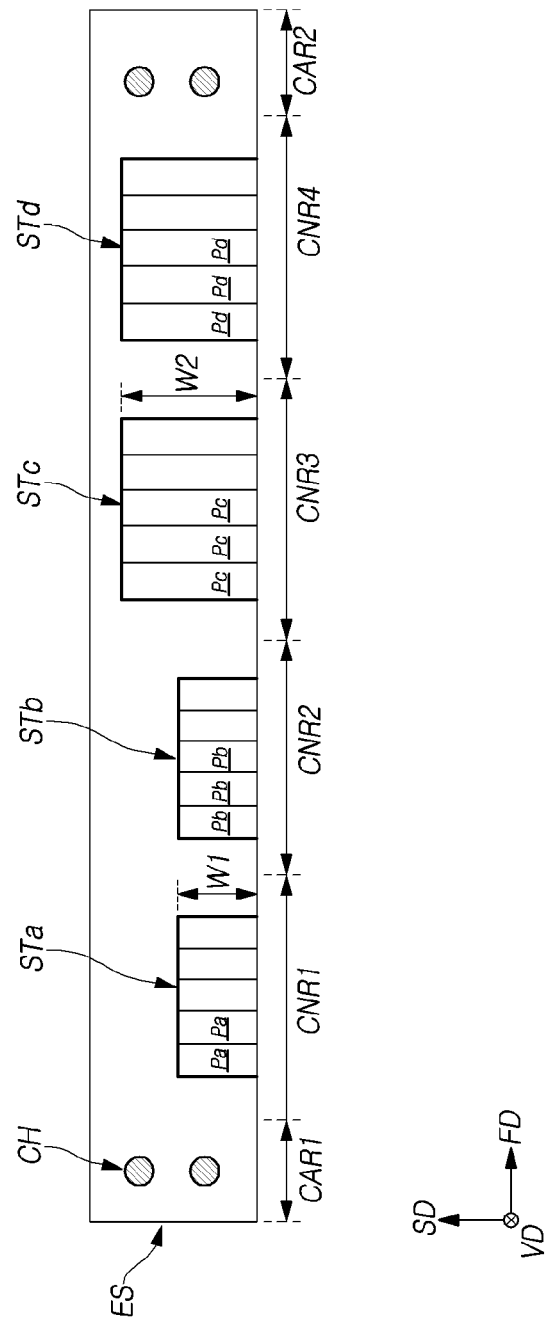
FIG. 1 is a top view schematically illustrating a three-dimensional memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the present disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

Hereinbelow, in the accompanying drawings, a direction vertically projecting from a top surface of a substrate is defined as a vertical direction VD, and two directions parallel to the top surface of the substrate and intersecting with each other are defined as a first direction FD and a second direction SD, respectively. For example, the first direction FD may correspond to the extending direction of a word line, and the second direction SD may correspond to the extending direction of a bit line. The first direction FD and the second direction SD may substantially perpendicularly intersect with each other. In the drawings, a direction indicated by an arrow and a direction opposite thereto represent the same direction.

Figure 2:
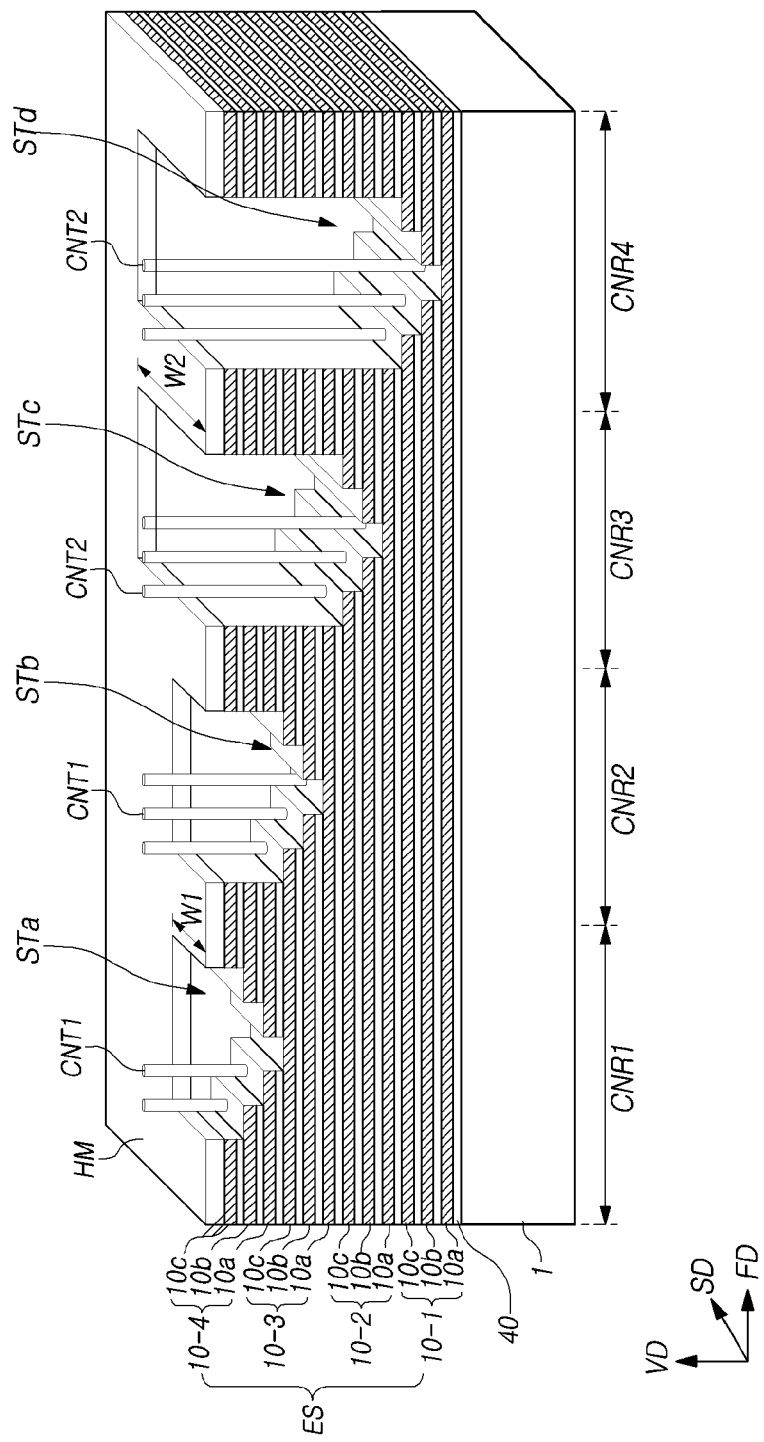
FIG. 2 is a perspective view illustrating an example of staircase structures of FIG. 1.

FIG. 1 is a top view schematically illustrating a three-dimensional memory device in accordance with an embodiment of the disclosure, and FIG. 2 is a perspective view illustrating an example of staircase structures of FIG. 1. For the sake of simplicity in illustration, in FIG. 1, the illustration of contacts CNT1 and CNT2 of FIG. 2 is omitted.

Referring to FIGS. 1 and 2, a three-dimensional memory device in accordance with an embodiment of the disclosure includes a plurality of electrode stacks 10-1 to 10-4 stacked on a substrate 1. Each of the plurality of electrode stacks 10-1 to 10-4 includes a plurality of electrode layers 10a to 10c and a plurality of interlayer dielectric layers 40, which are alternately stacked. A plurality of staircase structures STa to STd are defined in the plurality of electrode stacks 10-1 to 10-4, respectively, and are configured by pad regions of the plurality of electrode layers 10a to 10c that disposed in the shapes of staircases in the respective electrode stacks 10-1 to 10-4. The plurality of staircase structures STa to STd are configured such that the staircase structures STc and STd of lower electrode stacks 10-1 and 10-2 have a larger width in the second direction SD than the staircase structures STa and STb of upper electrode stacks 10-3 and 10-4.

In more detail, the substrate 1 may include a plurality of coupling regions CNR1 to CNR4, which are arranged in the first direction FD, and a first cell array region CAR1 and a second cell array region CAR2, which are disposed at both sides of the plurality of coupling regions CNR1 to CNR4 in the first direction FD. Although the present embodiment illustrates a case in which the coupling regions CNR1 to CNR4 are centrally disposed between the first cell array region CAR1 and the second cell array region CAR2, the disclosure is not limited thereto. For example, the coupling regions CNR1 to CNR4 may be disposed at the edges of a cell array region. For the sake of convenience in explanation, the coupling regions CNR1 to CNR4 are defined as first to fourth coupling regions CNR1 to CNR4.

The substrate 1 may include at least one from among silicon (Si), germanium (Ge), silicon germanium (SiGe), gallium arsenide (GaAs), indium gallium arsenide (InGaAs), aluminum gallium arsenide (AlGaAs) and a compound thereof. The substrate 1 may be a bulk silicon substrate, a silicon-on-insulator (SOI) substrate, a germanium substrate, a germanium-on-insulator (GOI) substrate, a silicon-germanium substrate, or a substrate of an epitaxial thin film obtained by performing selective epitaxial growth (SEG).

An electrode structure ES may be formed on the substrate 1. The electrode structure ES may extend in the first direction FD from the first cell array region CAR1 to the second cell array region CAR2, across the first to fourth coupling regions CNR1 to CNR4.

The electrode structure ES may include the plurality of electrode stacks 10-1 to 10-4, which are stacked on the substrate 1. The present embodiment illustrates four electrode stacks 10-1 to 10-4, and, for the sake of convenience in explanation, the electrode stacks 10-1 to 10-4 are defined as first to fourth electrode stacks 10-1 to 10-4. Other embodiments may have different numbers of electrode stacks.

Each of the plurality of electrode stacks 10-1 to 10-4 may include the plurality of electrode layers 10a to 10c and the plurality of interlayer dielectric layers 40, which are alternately stacked in the vertical direction VD.

The plurality of electrode layers 10a to 10c may include a conductive material. For example, the electrode layers 10a to 10c may include at least one selected from among a doped semiconductor (e.g., doped silicon), a metal (e.g., tungsten, copper or aluminum), a conductive metal nitride (e.g., a titanium nitride or a tantalum nitride) and a transition metal (e.g., titanium or tantalum). The interlayer dielectric layers 40 may include a dielectric material. For example, the interlayer dielectric layers 40 may include silicon oxide.

Among the electrode layers 10a to 10c of the plurality of electrode stacks 10-1 to 10-4, at least one electrode layer from the lowermost electrode layer may configure a source select line, and at least one electrode layer from the uppermost electrode layer may configure a drain select line. The electrode layers between the source select line and the drain select line may configure word lines.

In the first and second cell array regions CAR1 and CAR2, a plurality of vertical channels CH may be formed to pass through the electrode layers 10a to 10c and the interlayer dielectric layers 40 of the plurality of electrode stacks 10-1 to 10-4 in the vertical direction VD. Although not illustrated in detail, each of the vertical channels CH may include a channel layer and a gate dielectric layer. The channel layer may include polysilicon or monocrystalline silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A source select transistor may be configured in areas or regions where the source select line surrounds the vertical channel CH. Memory cells may be configured in areas or regions where the word lines surround the vertical channel CH. A drain select transistor may be configured in areas or regions where the drain select line surrounds the vertical channel CH. A source select transistor, a plurality of memory cells and a drain select transistor that are disposed along one vertical channel CH may configure one cell string.

In the first coupling region CNR1, each of the electrode layers 10a to 10c of the fourth electrode stack 10-4 may have a pad region Pa that is exposed by another electrode layer positioned thereon. The staircase structure STa may be formed in the first coupling region CNR1 by the pad regions Pa of the electrode layers 10a to 10c of the fourth electrode stack 10-4, which are disposed in a staircase shape in the first direction FD.

In the second coupling region CNR2, each of the electrode layers 10a to 10c of the third electrode stack 10-3 may have a pad region Pb that is exposed by another electrode layer positioned thereon. The pad regions Pb of the electrode layers 10a to 10c of the third electrode stack 10-3 are disposed in a staircase shape in the first direction FD such that the staircase structure STb may be formed in the second coupling region CNR2.

In the third coupling region CNR3, each of the electrode layers 10a to 10c of the second electrode stack 10-2 may have a pad region Pc that is exposed by another electrode layer positioned thereon. The staircase structure STc may be formed in the third coupling region CNR3 by the pad regions Pc of the electrode layers 10a to 10c of the second electrode stack 10-2 that are disposed in a staircase shape in the first direction FD.

In the fourth coupling region CNR4, each of the electrode layers 10a to 10c of the first electrode stack 10-1 may have a pad region Pd that is exposed by another electrode layer positioned thereon. The pad regions Pd of the electrode layers 10a to 10c of the first electrode stack 10-1 are disposed in a staircase shape in the first direction FD to form the staircase structure STd in the fourth coupling region CNR4.

In FIG. 2, the first and second electrode stacks 10-1 and 10-2 are positioned relatively lower in the vertical direction VD than the third and fourth electrode stacks 10-3 and 10-4. Staircase structures STa and STb are defined respectively in the fourth and third electrode stacks 10-4 and 10-3. Staircase structures STc and STd are defined respectively in the second and first electrode stacks 10-2 and 10-1. The staircase structures STc and STd may have a larger width in the second direction SD than the staircase structures STa and STb. For example, the staircase structures STa and STb may have a first width W1, and the staircase structures STc and STd may have a second width W2 that is larger than the first width W1. The width of the pad regions Pa configuring the staircase structure STa and the pad regions Pb configuring the staircase structure STb may be first width W1, and the width of the pad regions Pc configuring the staircase structure STc and the pad regions Pd configuring the staircase structure STd may be second width W2.

The staircase structures STa and STb having the first width W1 may be defined as being included in a first group, and the staircase structures STc and STd having the second width W2 may be defined as being included in a second group. Staircase structures belonging to a single group may have the same width. Furthermore, the staircase structures STa to STd may be organized into a plurality of numbered groups. Staircase structures may have widths that increase as the number of the group increases. For example, staircase structures in a second group may have a greater width than staircase structures in a first group.

Although FIGS. 1 and 2 illustrate staircase structures STa to STd that have widths that increase by the unit of a numbered group, the disclosure is not limited thereto. The staircase structures STa to STd may be configured to have individually different widths within a group.

A hard mask pattern HM may be formed on the electrode structure ES. The hard mask pattern HM is used as an etch mask in an etching process for forming the staircase structures STa to STd, and may be formed of a dielectric material that has an etching selectivity different from the interlayer dielectric layers 40 and first material layers 30, which will be described later with reference to FIGS. 5A to 5E. For example, when the first material layers 30 are formed of silicon nitride and the interlayer dielectric layers 40 are formed of silicon oxide, the hard mask pattern HM may be formed of a dielectric material that has an etching selectivity different from silicon oxide and silicon nitride.

A dielectric layer (not illustrated), which covers the staircase structures STa to STd, may be formed on the electrode structure ES, and a plurality of contacts CNT1 and CNT2 may be coupled to the pad regions Pa to Pd, respectively, of the staircase structures STa to STd by passing through the dielectric layer. The reference symbol CNT1 denotes contacts that are coupled to the pad regions Pa and Pb of the upper staircase structures STa and STb, and the reference symbol CNT2 denotes contacts that are coupled to the pad regions Pc and Pd of the lower staircase structures STc and STd.

As measured in a vertical direction VD from a top surface of the electrode stack ES, depths of the contacts CNT2 that are coupled to the pad regions Pc and Pd of the lower staircase structures STc and STd are greater than depths of the contacts CNT1 that are coupled to the pad regions Pa and Pb of the upper staircase structures STa and STb. The contacts CNT1 and CNT2 may be formed by forming a plurality of holes in the dielectric layer that expose the pad regions Pa to Pd and filling the plurality of holes with a conductive material. As hole depth increases, the possibility also increases for a contact coupling failure due to an insufficient overlay margin in the hole forming process.

According to embodiments of the disclosure, a width of the pad regions Pc and Pd of the lower staircase structures STc and STd, to which the contacts CNT2 having greater depths are coupled, may be configured to be greater than a width of the pad regions Pa and Pb of the upper staircase structures STa and STb, to which the contacts CNT1 having a smaller depth are coupled. As a result, an overlay margin may be increased and occurrences of a contact coupling failure may be prevented or minimized.

Figure 3:
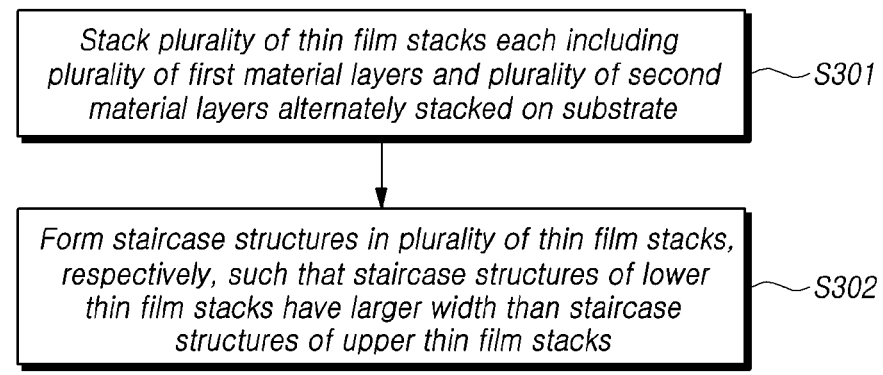
FIG. 3 is a flow chart illustrating a method for manufacturing a three-dimensional memory device in accordance with another embodiment of the disclosure.
Figure 4:
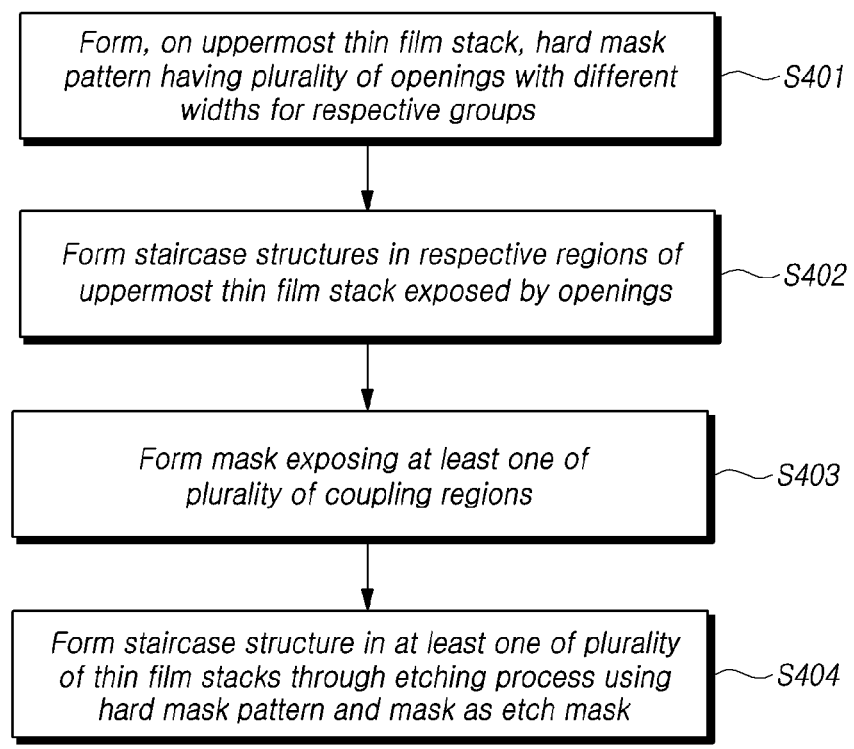
FIG. 4 is a flow chart illustrating a method for forming staircase structures of a three-dimensional memory device in accordance with a further embodiment of the disclosure.

FIG. 3 is a flow chart illustrating a method for manufacturing a three-dimensional memory device in accordance with another embodiment of the disclosure. FIG. 4 is a flow chart illustrating a method for forming staircase structures of a three-dimensional memory device in accordance with a further embodiment of the disclosure. FIGS. 5A to 5E are perspective views illustrating, by process steps, a three-dimensional memory device in accordance with an embodiment of the disclosure.

Referring to FIGS. 3 and 5A to 5E, a method for manufacturing a three-dimensional memory device in accordance with an embodiment of the disclosure may include a step S301 of forming a multi-layered stack 110 by stacking a plurality of thin film stacks 110-1 to 110-4. Each of the plurality of thin film stacks 110-1 to 110-4 may include a plurality of first material layers 30 and a plurality of second material layers 40 that are alternately stacked on a substrate 1. The method may include a step S302 of forming staircase structures STa to STd in the plurality of thin film stacks 110-1 to 110-4, respectively, such that the staircase structures STc and STd of lower thin film stacks 110-1 and 110-2 have a larger width in the second direction SD than the staircase structures STa and STb of upper thin film stacks 110-3 and 110-4.

Figure 5A:
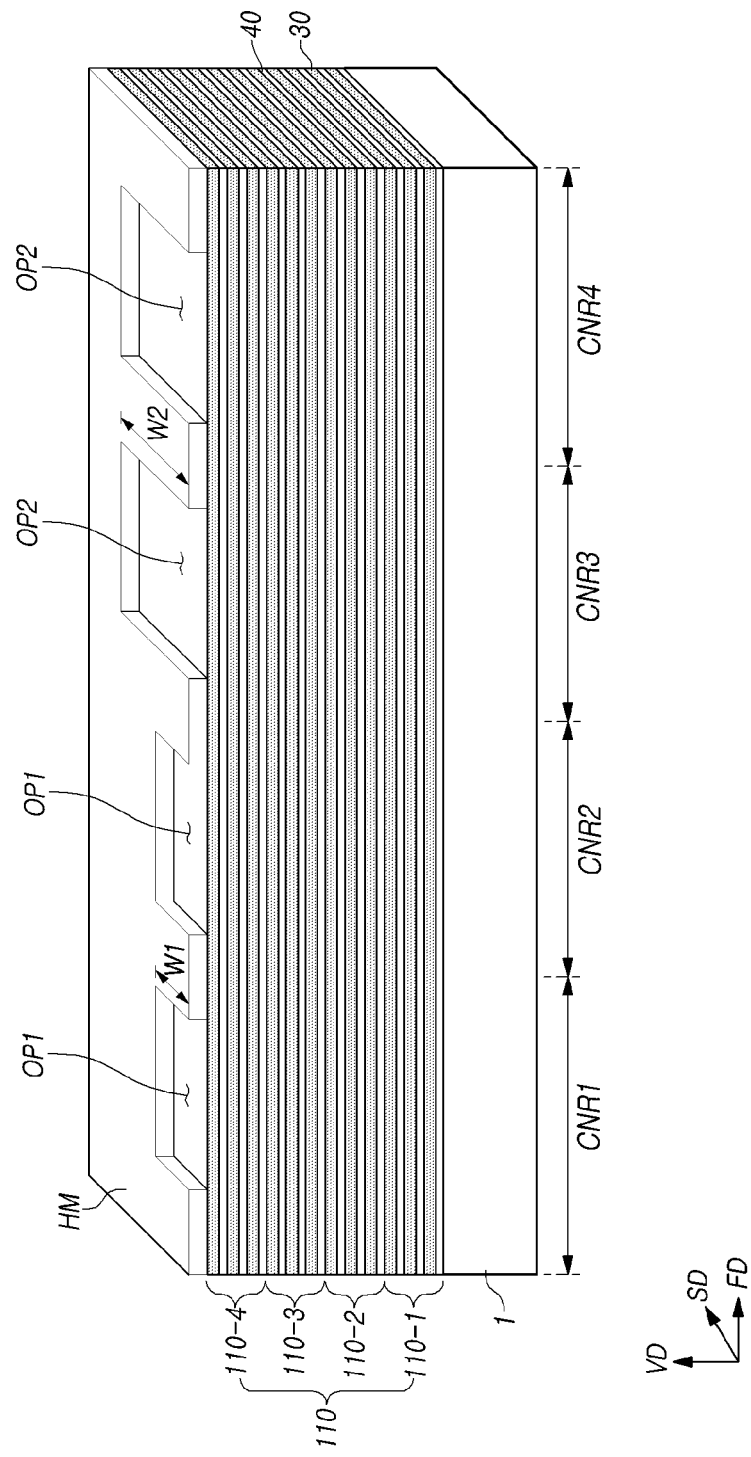
Figure 5B:
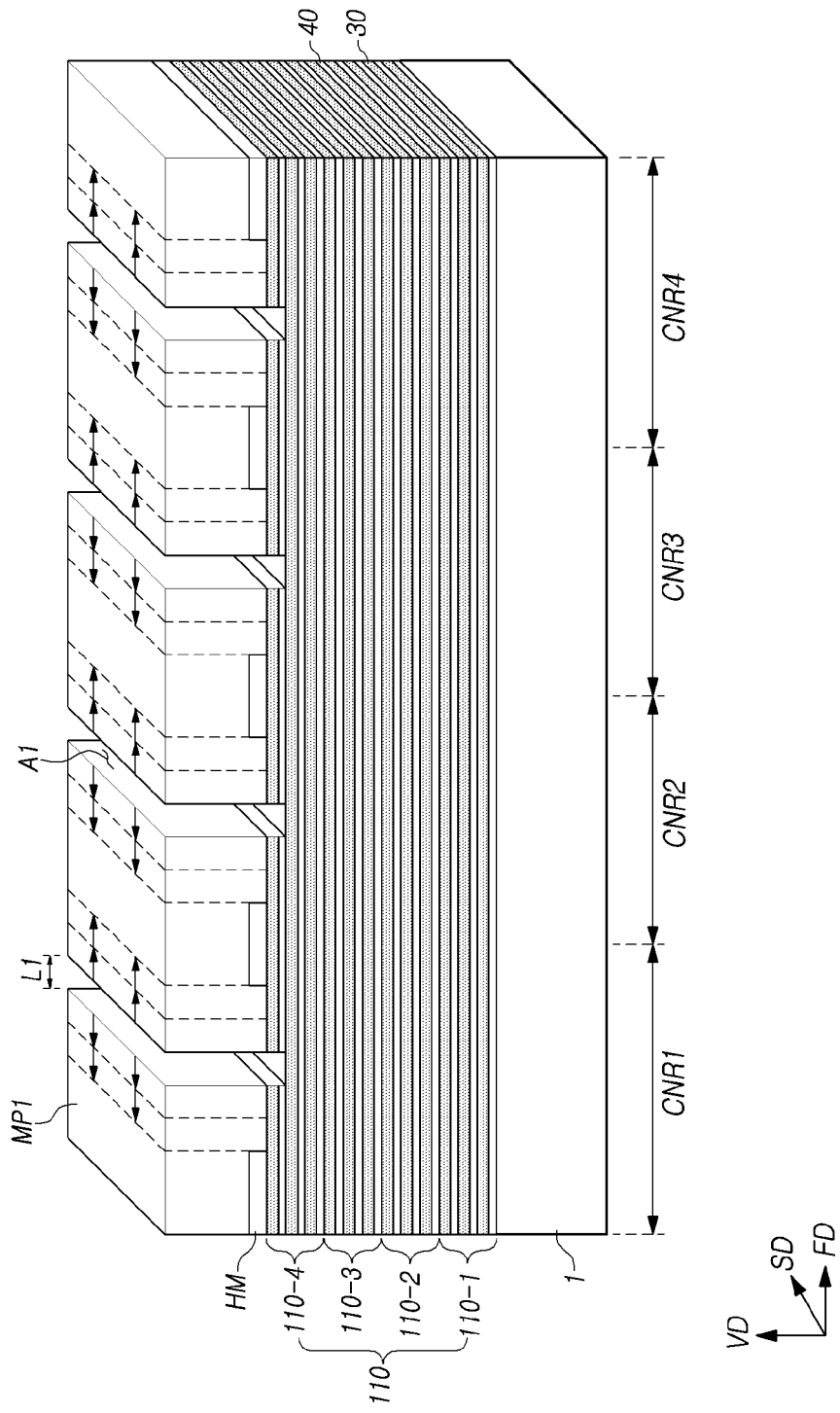
Figure 5C:
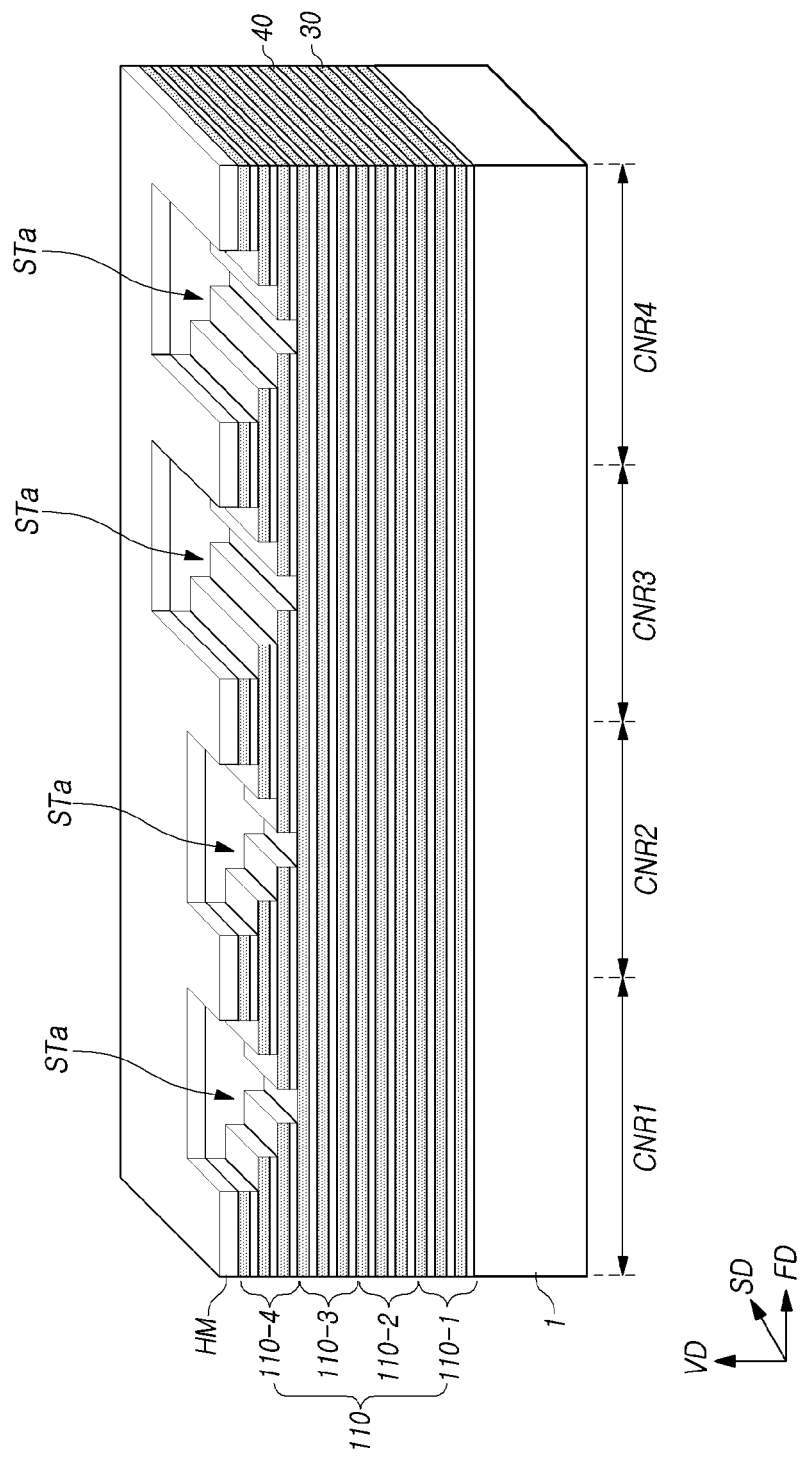
Figure 5D:
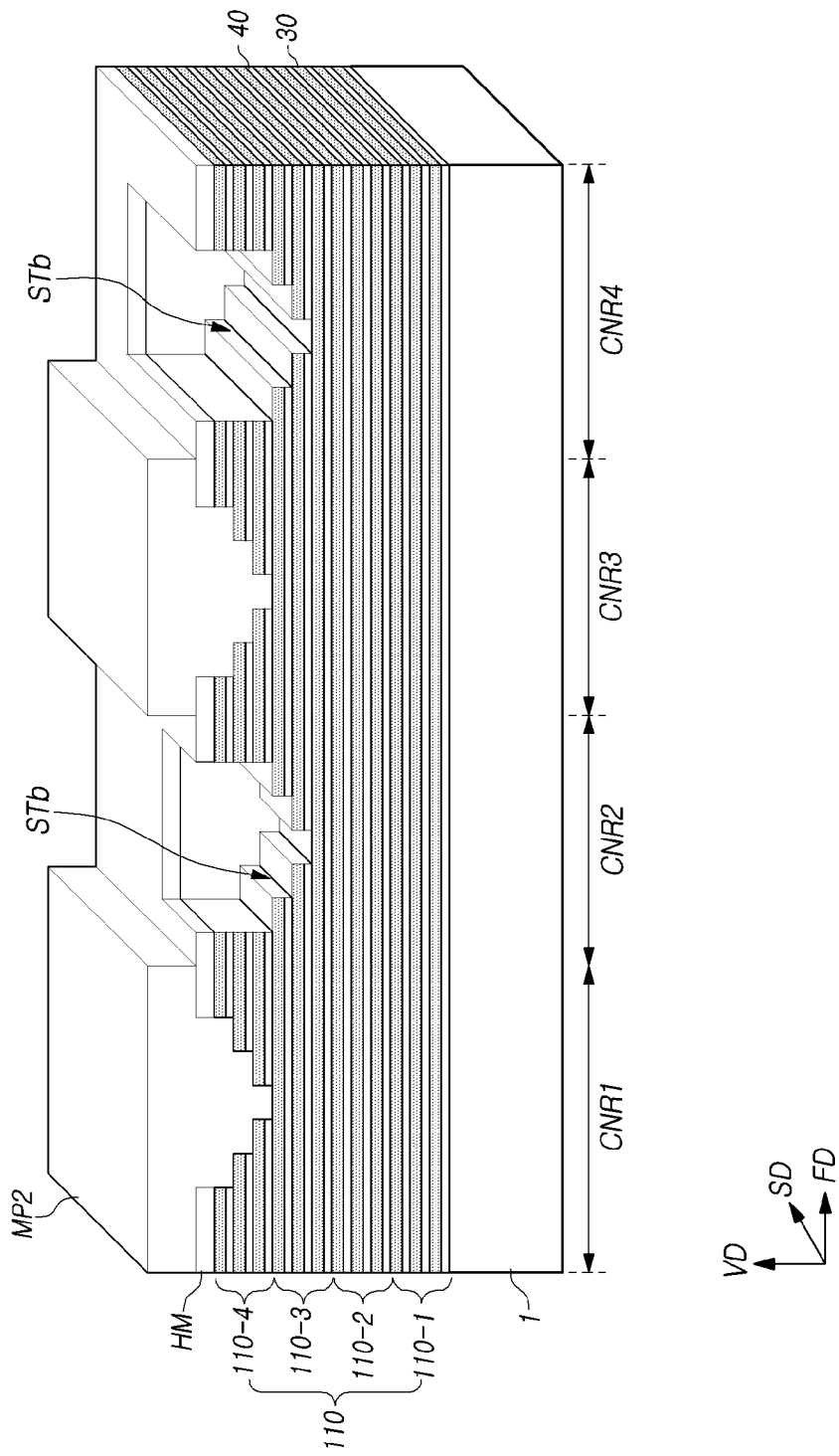

Referring to FIGS. 4 and 5A to 5E, a method of forming the staircase structures STa to STd may include a step S401 of forming, on an uppermost thin film stack 110-4, a hard mask pattern HM having a plurality of openings OP1 and OP2. Each of the plurality of openings is disposed in a corresponding one of a plurality of coupling regions CNR1 to CNR4 as illustrated in FIG. 5A. If the plurality of coupling regions CNR1 to CNR4 are organized into respective groups, then the plurality of openings OP1 and OP2 have different widths for each of the respective groups. As illustrated in FIG. 5C, the method may further include a step S402 of forming staircase structures STa in regions of the uppermost thin film stack 110-4 that are exposed by the plurality of openings OP1 and OP2. The method may further include a step S403 of forming a mask exposing at least one of the plurality of coupling regions CNR1 to CNR4, and a step S404 of forming a staircase structure in at least one of the plurality of thin film stacks 110-1 to 110-3 by etching a multi-layered stack 110 using the hard mask pattern HM and the mask as an etch mask. For example, as illustrated in FIG. 5D, thin film stack 110-3 is etched, and other thin film stacks may be etched as steps S403 and S404 are repeated.

In detail, referring to FIG. 5A, the multi-layered stack 110 may be formed by stacking thin film stacks 110-1 to 110-4 on the substrate 1.

Each of the plurality of thin film stacks 110-1 to 110-4 may include a plurality of first material layers 30 and a plurality of second material layers 40, which are alternately stacked. Hereinafter, for the sake of convenience in explanation, the thin film stacks 110-1 to 110-4 are defined as first to fourth thin film stacks 110-1 to 110-4, respectively.

In an embodiment, the plurality of first material layers 30 may include sacrificial layers, and the plurality of second material layers 40 may include interlayer dielectric layers. The plurality of first material layers 30 may be formed of a dielectric material that has a different etching selectivity from the plurality of second material layers 40. For example, the plurality of second material layers 40 may be formed of silicon oxide, and the plurality of first material layers 30 may be formed of silicon nitride. In another embodiment, the plurality of first material layers 30 may include a conductive material, and the plurality of second material layers 40 may include a dielectric material.

The hard mask pattern HM, which has the first openings OP1 and the second openings OP2, may be formed on the multi-layered stack 110. The hard mask pattern HM is used as an etch mask during processes of etching the multi-layered stack 110 as will be described later with reference to FIGS. 5B to 5E, and may be formed of a material that has a different etching selectivity from the plurality of first material layers 30 and the plurality of second material layers 40.

A first opening OP1 may be positioned in the first coupling region CNR1 and a first opening OP1 may be positioned in the second coupling region CNR2. A width of the first openings OP1 in the second direction SD may have a dimension W1. A second opening OP2 may be positioned in the third coupling region CNR3 and a second opening OP2 may be positioned in the fourth coupling region CNR4. A width of the second openings OP2 in the second direction SD may have a dimension W2, which is greater than W1.

Referring again to FIG. 5B, a first mask MP1 having openings A1, which are disposed in the first to fourth coupling regions CNR1 to CNR4, may be formed on the hard mask pattern HM and the multi-layered stack 110. The width of an opening A1 in the first direction FD may be L1. L1 may be substantially the same as the width of, in the first direction FD, each pad region (e.g., one of Pa to Pd) described above with reference to FIGS. 1 and 2.

A first etching process of etching the fourth thin film stack 110-4 by a first etching depth using the first mask MP1 and the hard mask pattern HM as an etch mask may be performed. For example, the first etching depth may be substantially the same as a vertical pitch of the layers in the plurality of first material layers 30 and in the plurality of second material layers 40. The vertical pitch may be defined as the sum of a thickness of one of the plurality of first material layers 30 and a thickness of one of the plurality of second material layers 40.

After the first etching process, a trimming process for the first mask MP1 may be performed. Accordingly, the width of the first mask MP1 in the first direction FD may be reduced, and thus, the width of the openings A1 in the first direction FD may be increased. In other words, the location of sidewalls of the first mask MP1 may be adjusted in the first direction FD. The adjusted distance of the sidewalls of the first mask MP1 may be substantially the same as the width of, in the first direction FD, each pad region (e.g., one of Pa to Pd) described above with reference to FIGS. 1 and 2.

The first etching process and the trimming process described above may be alternately and repeatedly performed. Consequently, as illustrated in FIG. 5C, the staircase structures STa may be formed in the regions of the fourth thin film stack 110-4 that are exposed by the openings OP1 and OP2.

The first mask MP1 may be formed by a photoresist. The first mask MP1 that remains after the staircase structures STa are formed may be removed through a strip process.

Referring to FIG. 5D, a second mask MP2 that exposes the multi-layered stack 110 in at least one of the first to fourth coupling regions CNR1 to CNR4 may be formed. For example, the second mask MP2 may expose the multi-layered stack 110 in the second coupling region CNR2 and the fourth coupling region CNR4, and may cover the multi-layered stack 110 in the first coupling region CNR1 and the third coupling region CNR3.

A second etching process of etching the multi-layered stack 110 to a second etching depth using the second mask MP2 and the hard mask pattern HM as an etch mask may be performed. The second etching depth may correspond to the thickness of one thin film stack (e.g., one of 110-1 to 110-4). For example, when one thin film stack (e.g., one of 110-1 to 110-4) is configured by three first material layers 30 and three second material layers 40, three first material layers 30 and three second material layers 40 may be etched by the second etching process.

Accordingly, the staircase structures STb may be formed in the second coupling region CNR2 and the fourth coupling region CNR4 of the third thin film stack 110-3. The staircase structure STb of the second coupling region CNR2 may be obtained by transferring the profile of the staircase structure STa (see FIG. 5C) of the second coupling region CNR2 downward in the vertical direction VD in the second etching process, the staircase structure STb of the second coupling region CNR2 may be formed with the same cross-sectional profile of the staircase structure STa (see FIG. 5C) of the second coupling region CNR2. Similarly, the staircase structure STb of the fourth coupling region CNR4 may be obtained by transferring the profile of the staircase structure STa (see FIG. 5C) of the fourth coupling region CNR4 downward in the vertical direction VD in the second etching process, the staircase structure STb of the fourth coupling region CNR4 may be formed with the same cross-sectional profile of the staircase structure STa (see FIG. 5C) of the fourth coupling region CNR4.

The second mask MP2 may be formed by a photoresist. The second mask MP2 remaining after the second etching process may be removed through a strip process.

Referring to FIG. 5E, a third mask MP3 that exposes at least one of the first to fourth coupling regions CNR1 to CNR4 may be formed. For example, the third mask MP3 may expose the multi-layered stack 110 in the third coupling region CNR3 and the fourth coupling region CNR4, and may block the multi-layered stack 110 in the first coupling region CNR1 and the second coupling region CNR2.

A third etching process of etching the multi-layered stack 110 to a third etching depth using the third mask MP3 and the hard mask pattern HM as an etch mask may be performed. The third etching depth may correspond to two times the height of any one of the thin film stacks 110-1 to 110-4. For example, when the one thin film stack is configured by three first material layers 30 and three second material layers 40, six first material layers 30 and six second material layers 40 may be etched in the third etching process.

Accordingly, a staircase structure STc may be formed in the second thin film stack 110-2 in the third coupling region CNR3, and a staircase structure STd may be formed in the first thin film stack 110-1 in the fourth coupling region CNR4. The staircase structure STc of the third coupling region CNR3 may be obtained by transferring the profile of the staircase structure STa (see FIG. 5C) of the third coupling region CNR3 downward in the vertical direction VD in the third etching process, the staircase structure STc of the third coupling region CNR3 may be formed with the same cross-sectional profile of the staircase structure STa (see FIG. 5C) of the third coupling region CNR3. Similarly, the staircase structure STd of the fourth coupling region CNR4 may be obtained by transferring the profile of the staircase structure STb (see FIG. 5D) of the fourth coupling region CNR4 downward in the vertical direction VD in the third etching process, the staircase structure STd of the fourth coupling region CNR4 may be formed with the same cross-sectional profile of the staircase structure STb (see FIG. 5D) of the fourth coupling region CNR4.

The third mask MP3 may be formed by a photoresist. The third mask MP3 remaining after the third etching process may be removed through a strip process.

In an embodiment that the first material layers 30 are made of sacrificial layer, electrode layers may be formed by replacing sacrificial layers in the plurality of first material layers 30 with a conductive material after the third etching process. In another embodiment that the first material layers 30 are made of conductive material, the step of replacing the first material layers 30 with a conductive material may be omitted.

Hereinbelow, various embodiments of the disclosure will be described with reference to FIGS. 6 to 12C. In the following description, repeated description for substantially the same configurations as those of the aforementioned embodiments will be omitted, and only differences will be described.

Figure 6:
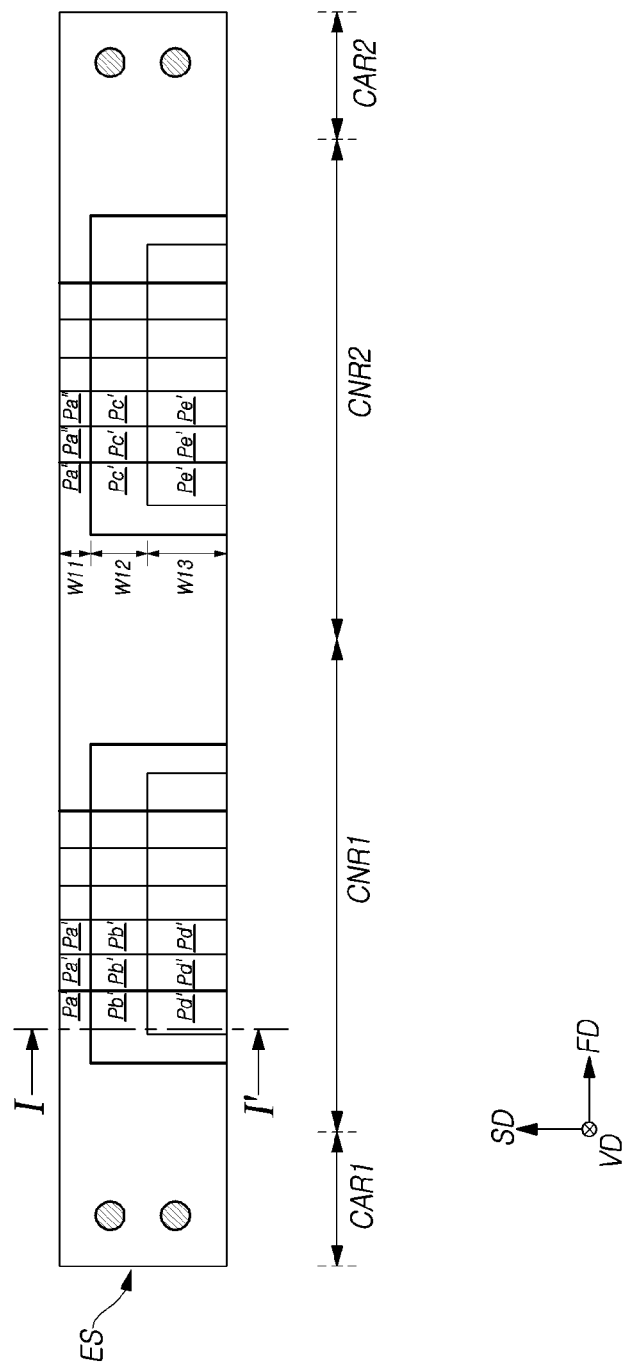
FIG. 6 is a top view schematically illustrating a three-dimensional memory device in accordance with still another embodiment of the disclosure.

FIG. 6 is a top view schematically illustrating a three-dimensional memory device in accordance with still another embodiment of the disclosure. FIG. 7 is a sectional view taken along line I-I' of FIG. 6, and FIG. 8 is a perspective view illustrating an example of staircase structures of FIG. 6.

Figure 8:
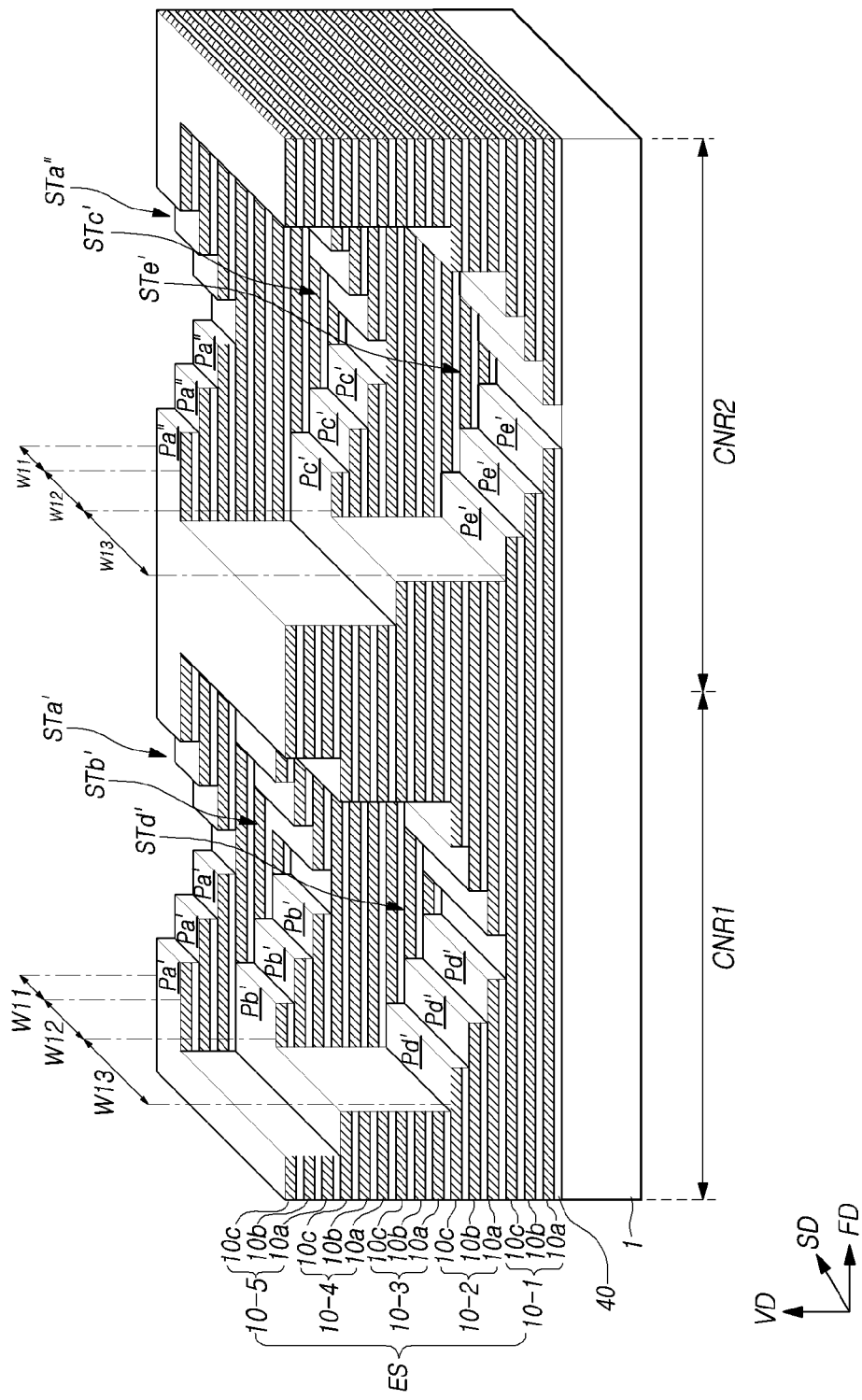
FIG. 8 is a perspective view illustrating an example of staircase structures of FIG. 6.

Referring to FIGS. 6 to 8, a substrate 1 may include a first coupling region CNR1 and a second coupling region CNR2 that are arranged in the first direction FD, and a first cell array region CAR1 and a second cell array region CAR2 which are disposed respectively adjacent to the first coupling region CNR1 and the second coupling region CNR2 in the first direction FD. Although FIGS. 6 to 8 illustrate the first coupling region CNR1 and the second coupling region CNR2 centrally disposed between the first cell array region CAR1 and the second cell array region CAR2, the disclosure is not limited thereto. For example, the first coupling region CNR1 and the second coupling region CNR2 may be disposed at the edges of a cell array region.

An electrode structure ES may be disposed on the substrate 1. The electrode structure ES may extend in the first direction FD from the first cell array region CAR1 to the second cell array region CAR2 across the first coupling region CNR1 and the second coupling region CNR2.

The electrode structure ES may include a plurality of electrode stacks 10-1 to 10-5, which are stacked on the substrate 1 in the vertical direction VD. Each of the plurality of electrode stacks 10-1 to 10-5 may include a plurality of electrode layers 10a to 10c that are alternately stacked with a plurality of interlayer dielectric layers 40. FIGS. 6 to 8 illustrate five electrode stacks 10-1 to 10-5 and for the sake of convenience in explanation, the electrode stacks 10-1 to 10-5 are defined as first to fifth electrode stacks 10-1 to 10-5. Other embodiments may have varying numbers of electrode stacks.

In the first coupling region CNR1, each of the electrode layers 10a to 10c of the fifth electrode stack 10-5 may have a pad region Pa' that is exposed by another electrode layer positioned thereon. A staircase structure STa' may be formed in the first coupling region CNR1 by the pad regions Pa' of the electrode layers 10a to 10c of the fifth electrode stack 10-5, which are disposed in a staircase shape in the first direction FD.

In the first coupling region CNR1, each of the electrode layers 10a to 10c of the fourth electrode stack 10-4 may have a pad region Pb' that is exposed by another electrode layer positioned thereon. A staircase structure STb' may be formed in the first coupling region CNR1 by the pad regions Pb' of the electrode layers 10a to 10c of the fourth electrode stack 10-4, which are disposed in a staircase shape in the first direction FD.

In the first coupling region CNR1, each of the electrode layers 10a to 10c of the second electrode stack 10-2 may have a pad region Pd' that is exposed by another electrode layer positioned thereon. A staircase structure STd' may be formed in the first coupling region CNR1 by the pad regions Pd' of the electrode layers 10a to 10c of the second electrode stack 10-2, which are disposed in a staircase shape in the first direction FD.

In the second coupling region CNR2, each of the electrode layers 10a to 10c of the fifth electrode stack 10-5 may have a pad region Pa" that is exposed by another electrode layer positioned thereon. A staircase structure STa" may be formed in the second coupling region CNR2 by the pad regions Pa" of the electrode layers 10a to 10c of the fifth electrode stack 10-5, which are disposed in a staircase shape in the first direction FD.

In the second coupling region CNR2, each of the electrode layers 10a to 10c of the third electrode stack 10-3 may have a pad region Pc' that is exposed by another electrode layer positioned thereon. A staircase structure STc' may be formed in the second coupling region CNR2 by the pad regions Pc' of the electrode layers 10a to 10c of the third electrode stack 10-3, which are disposed in a staircase shape in the first direction FD.

In the second coupling region CNR2, each of the electrode layers 10a to 10c of the first electrode stack 10-1 may have a pad region Pe' that is exposed by another electrode layer positioned thereon. A staircase structure STe' may be formed in the second coupling region CNR2 by the pad regions Pe' of the electrode layers 10a to 10c of the first electrode stack 10-1, which are disposed in a staircase shape in the first direction FD.

For the sake of convenience in explanation, the staircase structures STa', STb' and STd' disposed in the first coupling region CNR1 are defined as first staircase structures, and the staircase structures STa", STc' and STe' disposed in the second coupling region CNR2 are defined as second staircase structures.

The first staircase structures STa', STb' and STd' may be arranged in the second direction SD in the first coupling region CNR1, and the second staircase structures STa", STc' and STe' may be arranged in the second direction SD in the second coupling region CNR2. By disposing, in this way, a plurality of staircase structures in the second direction SD, which is perpendicular to the first direction FD as an extending direction of the electrode structure ES, the number of coupling regions required for disposing multiple staircase structures may be reduced, and the area consumed by the staircase structures may also be reduced.

The first staircase structures STa', STb' and STd' may be configured such that a first staircase structure positioned at a relatively lower vertical height in the multi-layered stack 110 has a larger width in the second direction SD than a first staircase structure positioned at a higher relative vertical height. For example, in FIG. 8, the first staircase structure STa' may be the highest and have the smallest first width W11, and the first staircase structure STd' may be the lowest and may have the largest third width W13. The first staircase structure STb' positioned between the highest first staircase structure STa' and the lowest first staircase structure STd' may have a second width W12 that is larger than the first width W11 and smaller than third width W13 in the second direction SD.

Similarly, the second staircase structures STa", STc' and STe' may be configured such that a second staircase structure positioned at a relatively lower vertical position has a larger width in the second direction SD than a second staircase structure positioned at a higher level. The second staircase structure STa" in the highest position may have the first width W11, while the second staircase structure STc' positioned in between may have the second width W12, which is larger than the first width W11, and the second staircase structure STe' in the lowest vertical position in the multi-layered stack 110 may have the third width W13, which is larger than the second width W12 in the second direction SD.

The number of first staircase structures positioned in the first coupling region CNR1 and the number of second staircase structures positioned in the second coupling region CNR2 may be the same. FIGS. 6 to 8 illustrate three first staircase structures and three second staircase structures, but the number may vary in different embodiments.

The second staircase structures STa", STc' and STe' may correspond to the first staircase structures STa', STb' and STd', respectively. In a top view, such as in FIG. 6, a first staircase structure and a second staircase structure corresponding to each other may be disposed in a line in the first direction FD, and may have the same width in the second direction SD. In detail, the second staircase structure STa" may correspond to the first staircase structure STa', and the first staircase structure STa' and the second staircase structure STa" may be disposed in a line in the first direction FD when viewed from the top and may each have the first width W11 in the second direction SD. Similarly, the second staircase structure STc' may correspond to the first staircase structure STb', and the first staircase structure STb' and the second staircase structure STc' may be disposed in a line in the first direction FD when viewed from the top and may each have the second width W12 in the second direction SD. Further, the second staircase structure STe' may correspond to the first staircase structure STd', and the first staircase structure STd' and the second staircase structure STe' may be disposed in a line in the first direction FD when viewed from the top and may each have the third width W13 in the second direction SD.

If all the staircase structures STa' to STe' and STa" are formed to have larger or the same widths in order to secure contact overlay margins, then the overall width of the electrode structure ES in the second direction SD must also increase. In embodiments of the disclosure, however, by configuring a width of a lower staircase structure (for which it is relatively difficult to secure an overlay margin) to be greater than a width of an upper staircase structure (for which is relatively easy to secure an overlay margin), it is possible to secure a contact overlay margin for multiple staircase structures without increasing the overall width of the electrode structure ES.

Figure 9:
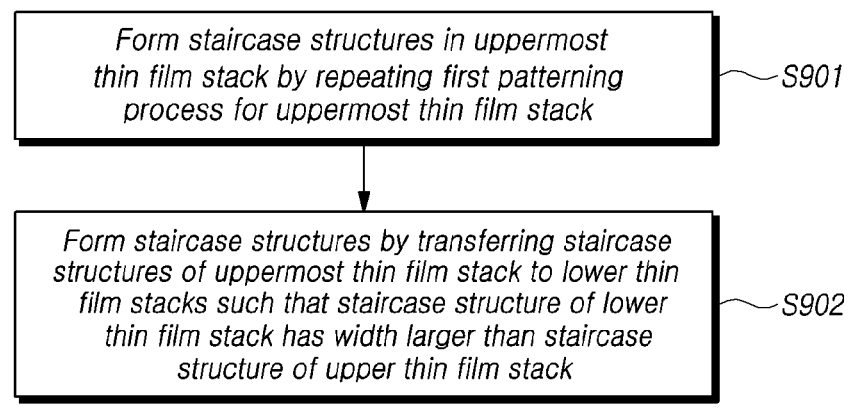
FIG. 9 is a flow chart illustrating a method for forming staircase structures of a three-dimensional memory device in accordance with yet another embodiment of the disclosure.

FIG. 9 is a flow chart illustrating a method for forming staircase structures of a three-dimensional memory device in accordance with yet another embodiment of the disclosure. FIGS. 10A to 10E are perspective views illustrating, by process steps, a three-dimensional memory device in accordance with an embodiment of the disclosure.

Referring to FIGS. 9 and 10A to 10E, a method for forming staircase structures of a three-dimensional memory device in accordance with yet another embodiment of the disclosure may include a step S901 of forming staircase structures STa' and STa" in an uppermost thin film stack 110-5 by repeating a first patterning process for the uppermost thin film stack 110-5. The method may further include a step S902 of forming staircase structures STb' to STe' in other thin film stacks 110-1 to 110-4, which are positioned below the uppermost thin film stack 110-5, by transferring the staircase structures STa' and STa" of the uppermost thin film stack 110-5 downward to the other thin film stacks 110-1 to 110-4, such that staircase structures of lower thin film stacks have widths in the second direction SD that may be larger than widths of staircase structures of upper thin film stacks.

Figure 10A:
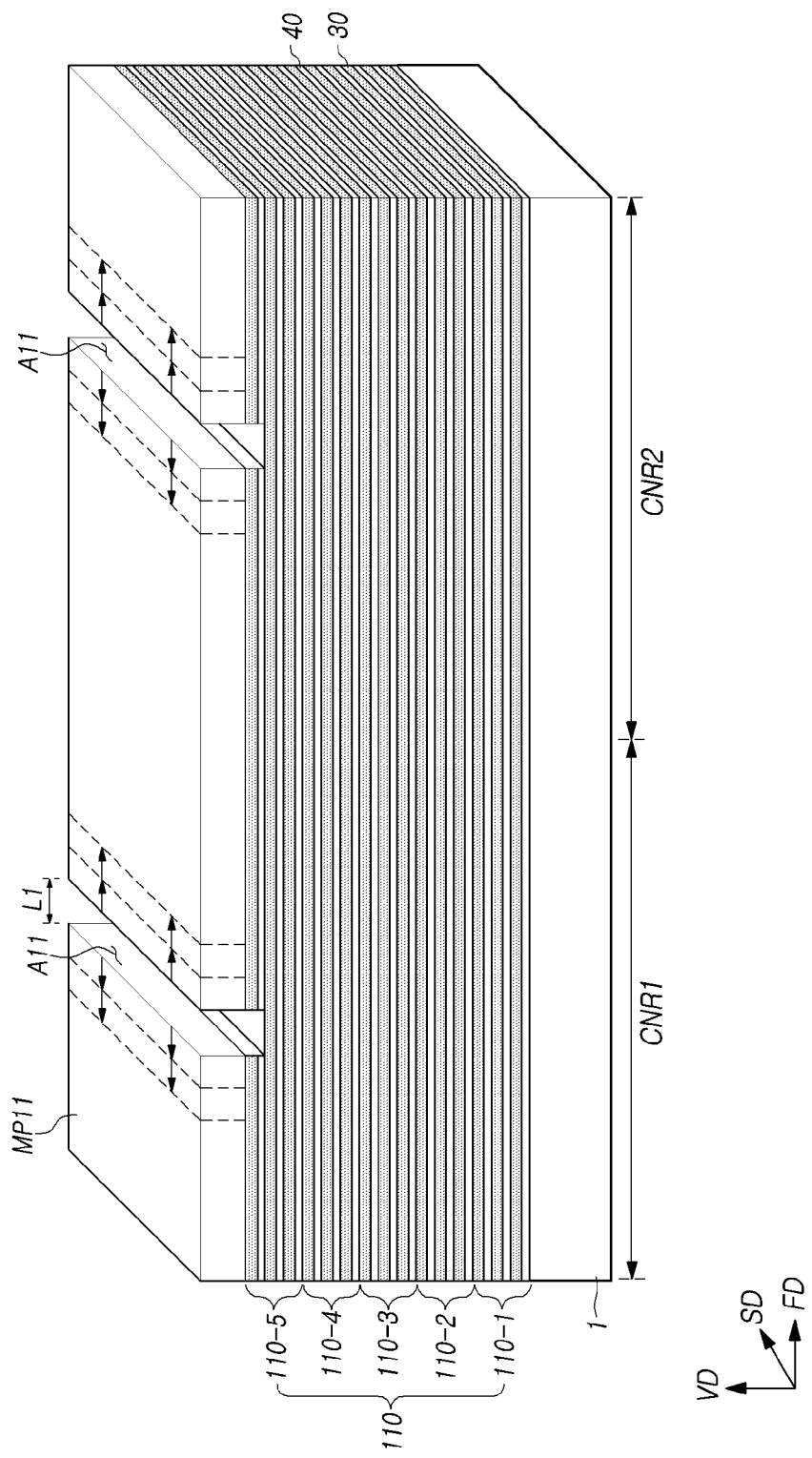

In detail, referring to FIG. 10A, a multi-layered stack 110 may be formed by stacking the plurality of thin film stacks 110-1 to 110-5 on a substrate 1. Each of the plurality of thin film stacks 110-1 to 110-5 may include a plurality of first material layers 30 and a plurality of second material layers 40, which are alternately stacked. Hereinafter, for the sake of convenience in explanation, the thin film stacks 110-1 to 110-5 are defined as first to fifth thin film stacks, respectively.

A first mask MP11 may be formed on the multi-layered stack 110. The first mask MP11 may have openings A11 in first coupling region CNR1 and the second coupling region CNR2, respectively. A width of each of the openings A11 in the first direction FD may be L1. L1 may be the same as the width of, in the first direction FD, each pad region (e.g., one of Pa' to Pe' and Pa") described above with reference to FIGS. 6 to 8.

A first etching process of etching portions of the fifth thin film stack 110-5 by a first etching depth using the first mask MP11 as an etch mask may be performed. For example, the first etching depth may be substantially the same as a vertical pitch of the layers in the plurality of first material layers 30 and in the plurality of second material layers 40. The vertical pitch may be defined as the sum of a thickness of one of the plurality of first material layers 30 and a thickness of one of the plurality of second material layers 40.

After the first etching process, a trimming process for the first mask MP11 may be performed. Accordingly, the width of the first mask MP11 in the first direction FD may be reduced, and thus, the width of the openings A11 in the first direction FD may be increased. In other words, the location of sidewalls of the first mask MP11 may be adjusted in the first direction FD. The adjusted distance of the sidewalls of the first mask MP11 may be the same as the width of, in the first direction FD, each pad region (e.g., one of Pa' to Pe' and Pa") described above with reference to FIGS. 6 to 8.

Figure 10B:
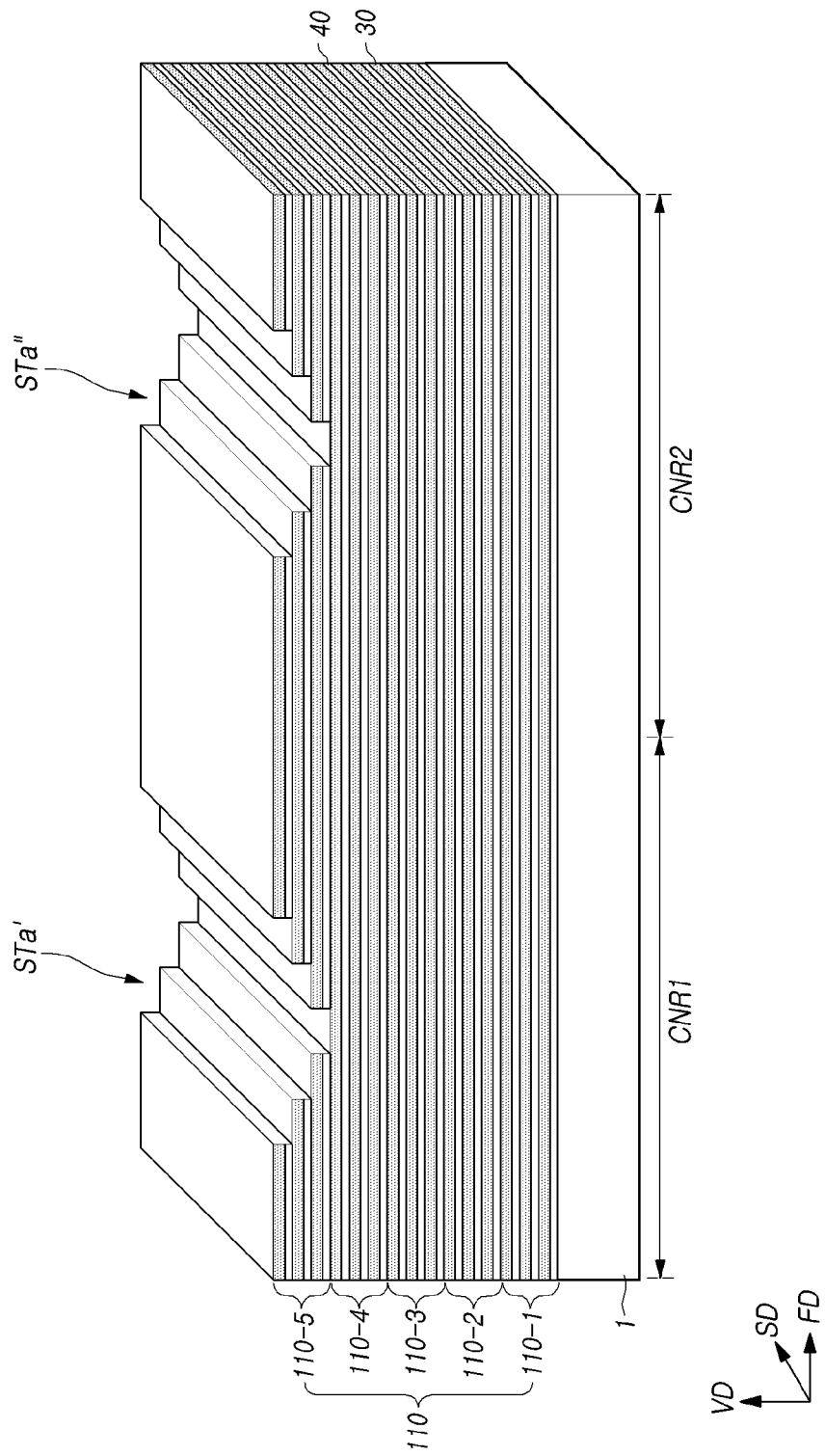

The first etching process and the trimming process described above may be alternately and repeatedly performed. Consequently, as illustrated in FIG. 10B, the staircase structures STa' and STa" may be formed in the first coupling region CNR1 and the second coupling region CNR2, respectively, of the fifth thin film stack 110-5.

The first mask MP11 may be formed by a photoresist. The first mask MP11 that remains after the staircase structures STa' and STa" are formed may be removed through a strip process.

Figure 10C:
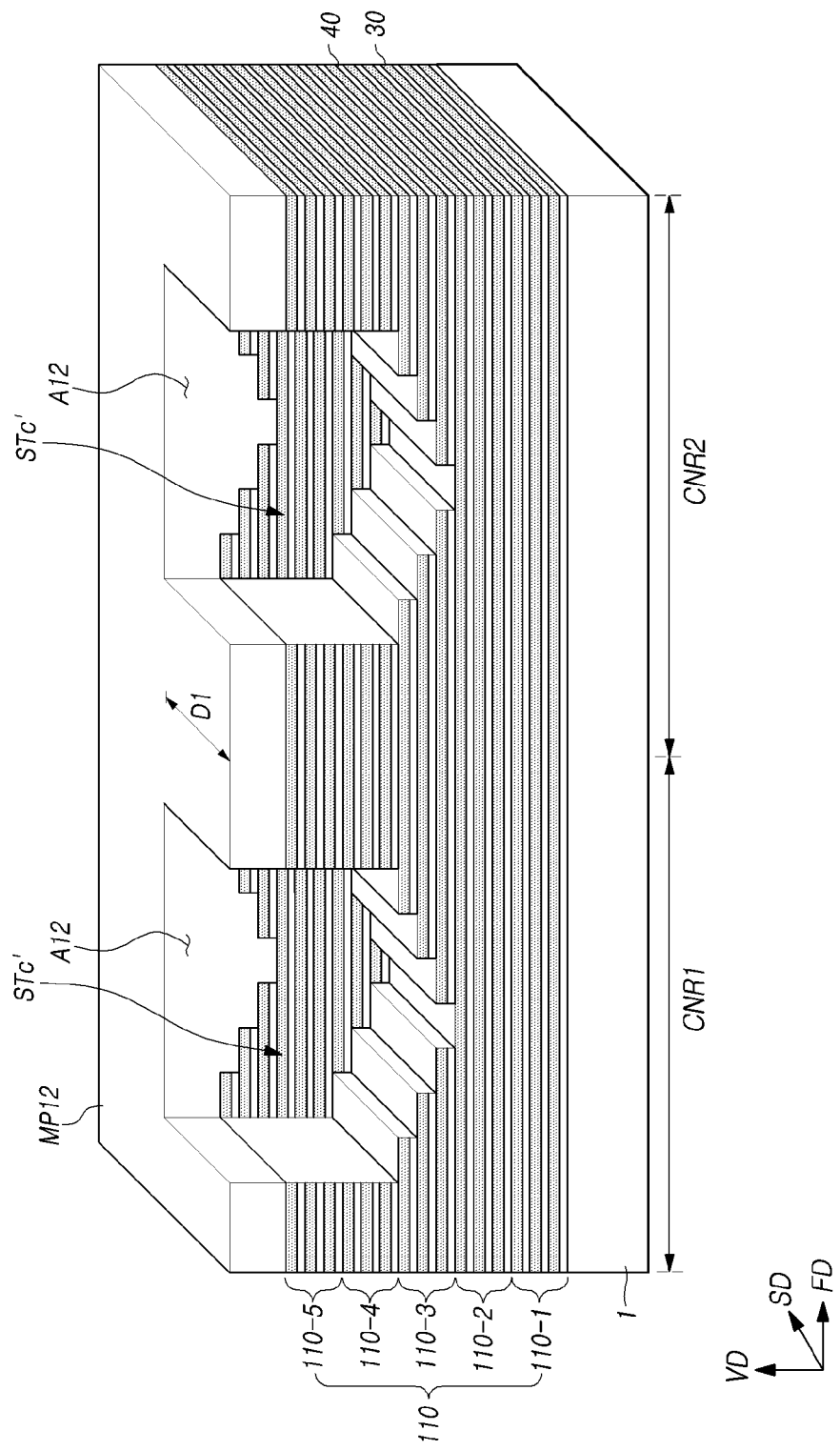

Referring to FIG. 10C, a second mask MP12 may be formed with openings A12 that expose portions of the multi-layered stack 110 in the first coupling region CNR1 and the second coupling region CNR2. The width of each of the openings A12 in the second direction SD may be D1, which may be substantially the same as the third width W13 described above with reference to FIGS. 6 to 8.

A second etching process of etching the multi-layered stack 110 to a second etching depth using the second mask MP12 as an etch mask may be performed. The second etching depth may correspond to two times the thickness of one thin film stack (e.g., one of 110-1 to 110-4). For example, when one thin film stack (e.g., one of 110-1 to 110-4) is configured by three first material layers 30 and three second material layers 40, six first material layers 30 and six second material layers 40 may be etched by the second etching process.

Accordingly, staircase structures STc' may be formed in the first coupling region CNR1 and the second coupling region CNR2, respectively, of the third thin film stack 110-3.

The second mask MP12 may be formed by a photoresist. The second mask MP12 remaining after the second etching process may be removed through a strip process.

Figure 10D:
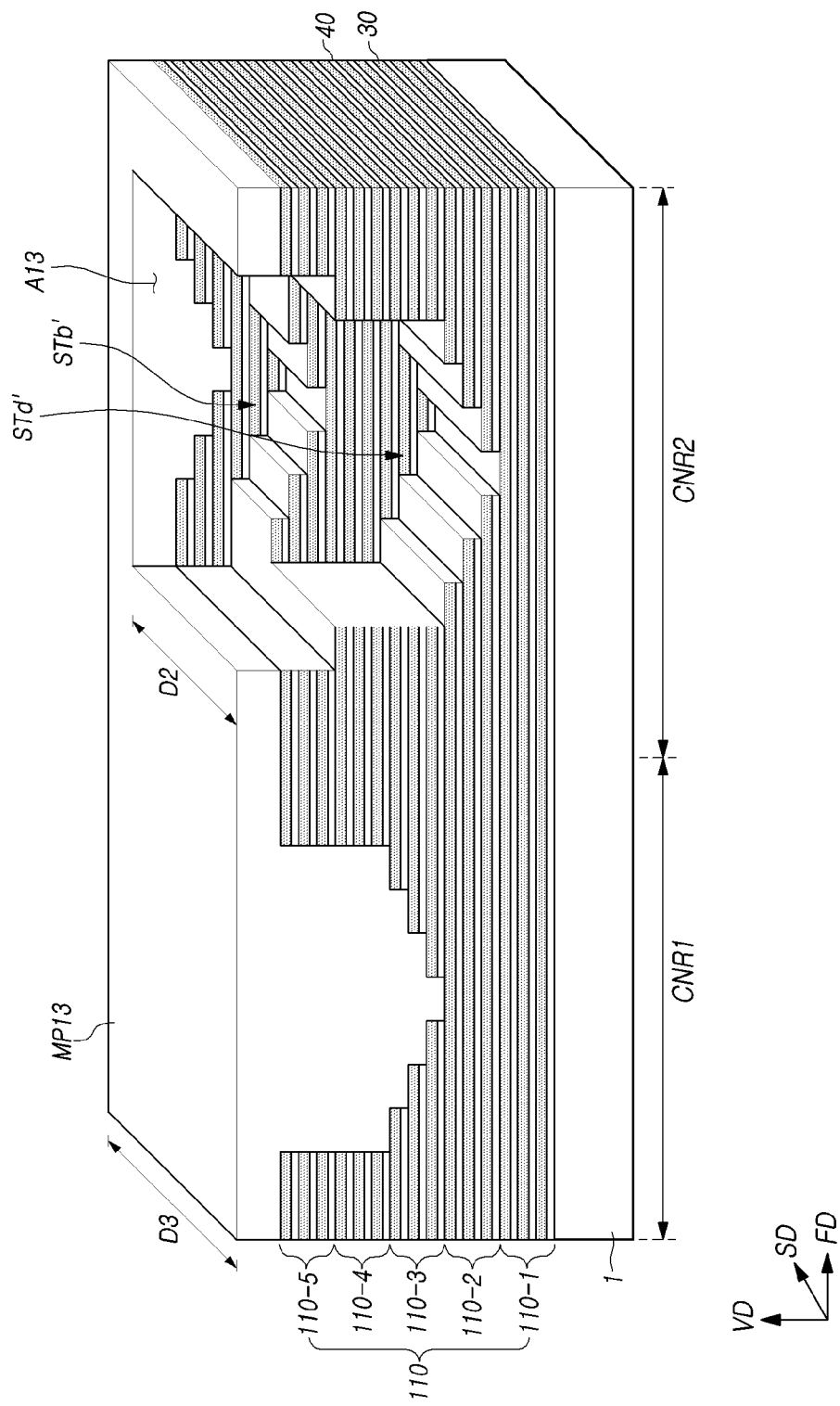

Referring to FIG. 10D, a third mask MP13 may be formed with an opening A13 that exposes a portion of the second coupling region CNR2 of the multi-layered stack 110. The width of the opening A13 in the second direction SD may be D2, which is larger than width D1.

A difference between width D2 and width D1 may be substantially the same as the second width W12 described above with reference to FIGS. 6 to 8. Furthermore, a difference between width D3 of the multi-layered stack 110 and width D2 may be substantially the same as the first width W11 described above with reference to FIGS. 6 to 8. The third width W13 is larger than the second width W12, and the second width W12 is larger than the first width W11 as described above with reference to FIGS. 6 to 8. Therefore, width D1 is larger than the difference between width D2 and width D1, and the difference between width D2 and width D1 is larger than the difference between width D3 and width D2.

A third etching process of etching the multi-layered stack 110 to a third etching depth using the third mask MP13 as an etch mask may be performed. The third etching depth may correspond to the height of any one of the thin film stacks 110-1 to 110-5. For example, when the one thin film stack is configured by three first material layers 30 and three second material layers 40, three first material layers 30 and three second material layers 40 may be etched by the third etching process.

Accordingly, a staircase structure STb' may be formed in the second coupling region CNR2 of the fourth thin film stack 110-4, and a staircase structure STd' may be formed in the second coupling region CNR2 of the second thin film stack 110-2.

The third mask MP13 may be formed of a photoresist. The third mask MP13 that remains after the third etching process may be removed through a strip process.

Referring to FIG. 10E, a fourth mask MP14 may be formed with openings A14 that expose portions of the first coupling region CNR1 and the second coupling region CNR2, respectively, of the multi-layered stack 110. The width of each of the openings A14 in the second direction SD may have a size of width D2.

A fourth etching process of etching the multi-layered stack 110 to a fourth etching depth using the fourth mask MP14 as an etch mask may be performed. The fourth etching depth may be the same as the third etching depth.

Accordingly, a staircase structure STb' may be formed in the first coupling region CNR1 of the fourth thin film stack 110-4, and a staircase structure STd' may be formed in the first coupling region CNR1 of the second thin film stack 110-2. Moreover, a staircase structure STc' may be formed in the second coupling region CNR2 of the third thin film stack 110-3, and a staircase structure STe' may be formed in the second coupling region CNR2 of the first thin film stack 110-1.

The fourth mask MP14 may be formed of a photoresist. The fourth mask MP14 remaining after the fourth etching process may be removed through a strip process.

Figure 11:
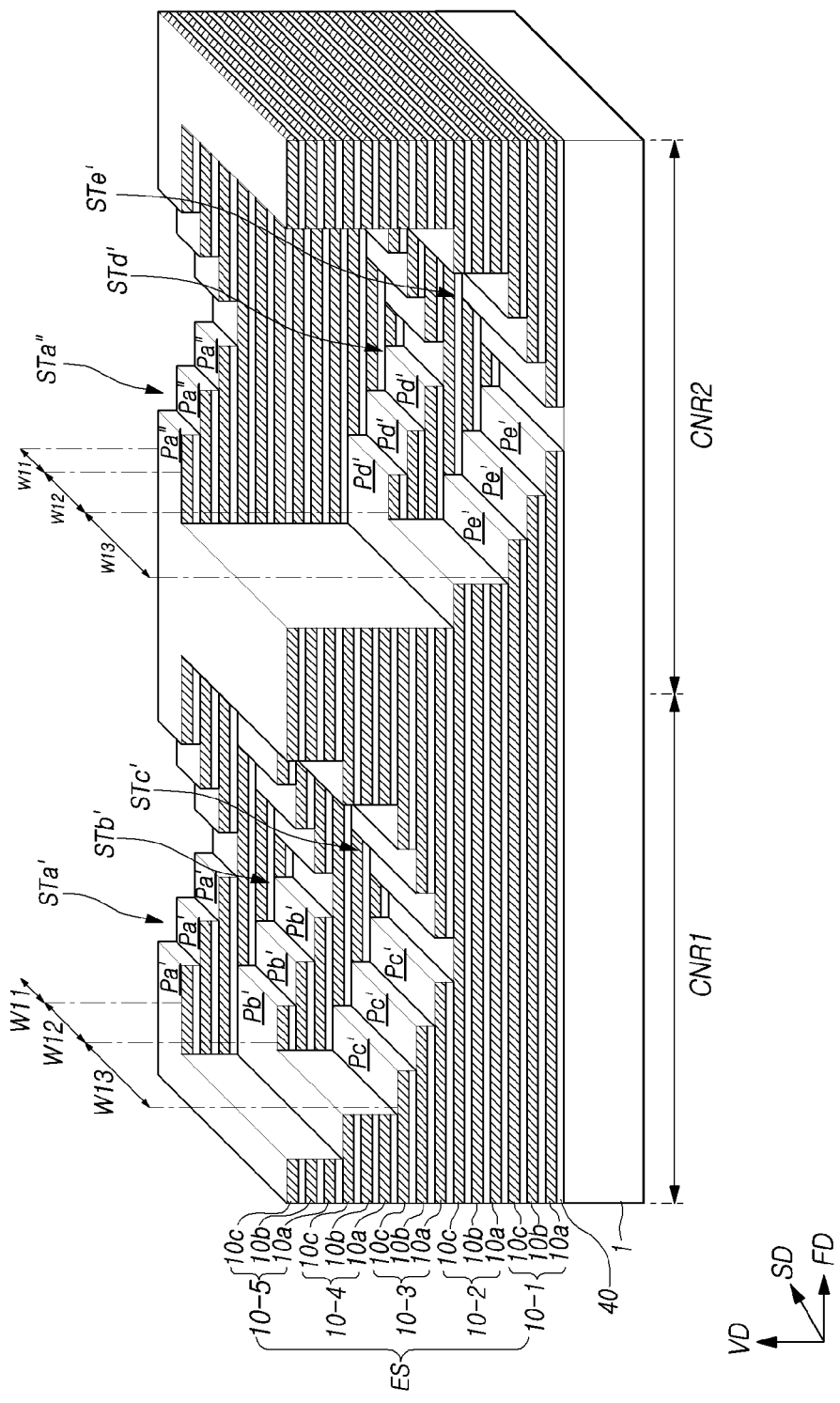
FIG. 11 is a perspective view illustrating staircase structures of a three-dimensional memory device in accordance with a further embodiment of the disclosure.

FIG. 11 is a perspective view illustrating staircase structures of a three-dimensional memory device in accordance with a further embodiment of the disclosure.

Referring to FIG. 11, a three-dimensional memory device in accordance with an embodiment of the disclosure may differ from the three-dimensional memory device described above with reference to FIG. 8 in that the position of the staircase structure STd' of the second electrode stack 10-2 of FIG. 8 is changed to the second coupling region CNR2 in FIG. 11. Similarly, the position of the staircase structure STc' of the third electrode stack 10-3 of FIG. 8 is changed to the first coupling region CNR1 in FIG. 11. Because the staircase structures STc' and STd' in FIG. 8 are switched into different vertical positions in FIG. 11, the width W13 of the staircase structure STc' of the third electrode stack 10-3 is larger than the width W12 of the staircase structure STd' of the second electrode stack 10-2 in FIG. 11.

In detail, in FIG. 11, staircase structures STa', STb' and STc' may be disposed in the first coupling region CNR1, and staircase structures STa", STd' and STe' may be disposed in the second coupling region CNR2. The staircase structures STa', STb' and STc' disposed in the first coupling region CNR1 may be defined as first staircase structures, and the staircase structures STa", STd' and STe' disposed in the second coupling region CNR2 may be defined as second staircase structures.

The first staircase structures STa', STb' and STc' may be arranged in the second direction SD in the first coupling region CNR1, and the second staircase structures STa", STd' and STe' may be arranged in the second direction SD in the second coupling region CNR2.

Among the first staircase structures STa', STb' and STc', a first staircase structure positioned at a relatively lower vertical height in an electrode structure ES may have a larger width in the second direction SD than a first staircase structure positioned at a higher relative vertical height. That is to say, the first staircase structure STa' positioned highest and may have the smallest first width W11. The first staircase structure STb' positioned at the middle position in the vertical direction VD may have a second width W12 that is larger than the first width W11, and the first staircase structure STc' may be the lowest and may have the largest third width W13, which is greater than the second width W12.

Similarly, among the second staircase structures STa", STd' and STe', a second staircase structure positioned at a relatively lower vertical position may have a larger width than a second staircase structure positioned at a higher level. That is to say, the second staircase structure STa" positioned uppermost may have the first width W11, while the second staircase structure STd' positioned in between may have the second width W12, which is larger than the first width W11, and the second staircase structure STe' in the lowest vertical position may have the third width W13, which is larger than the second width W12.

The second staircase structures STa", STd' and STe' may correspond to the first staircase structures STa', STb' and STc', respectively. In a top view, a first staircase structure and a second staircase structure corresponding to each other may be disposed in a line in the first direction FD, and may have the same width in the second direction SD.

In detail, the second staircase structure STa" may correspond to the first staircase structure STa', and the first staircase structure STa' and the second staircase structure STa" may be disposed in a line in the first direction FD when viewed from the top and may each have the same width W11 in the second direction SD. Similarly, the second staircase structure STd' may correspond to the first staircase structure STb', and the first staircase structure STb' and the second staircase structure STd' may be disposed in a line in the first direction FD when viewed from the top and may each have the same width W12 in the second direction SD. Further, the second staircase structure STe' may correspond to the first staircase structure STc', and the first staircase structure STc' and the second staircase structure STe' may be disposed in a line in the first direction FD when viewed from the top and may each have the same width W13 in the second direction SD.

Figure 12B:
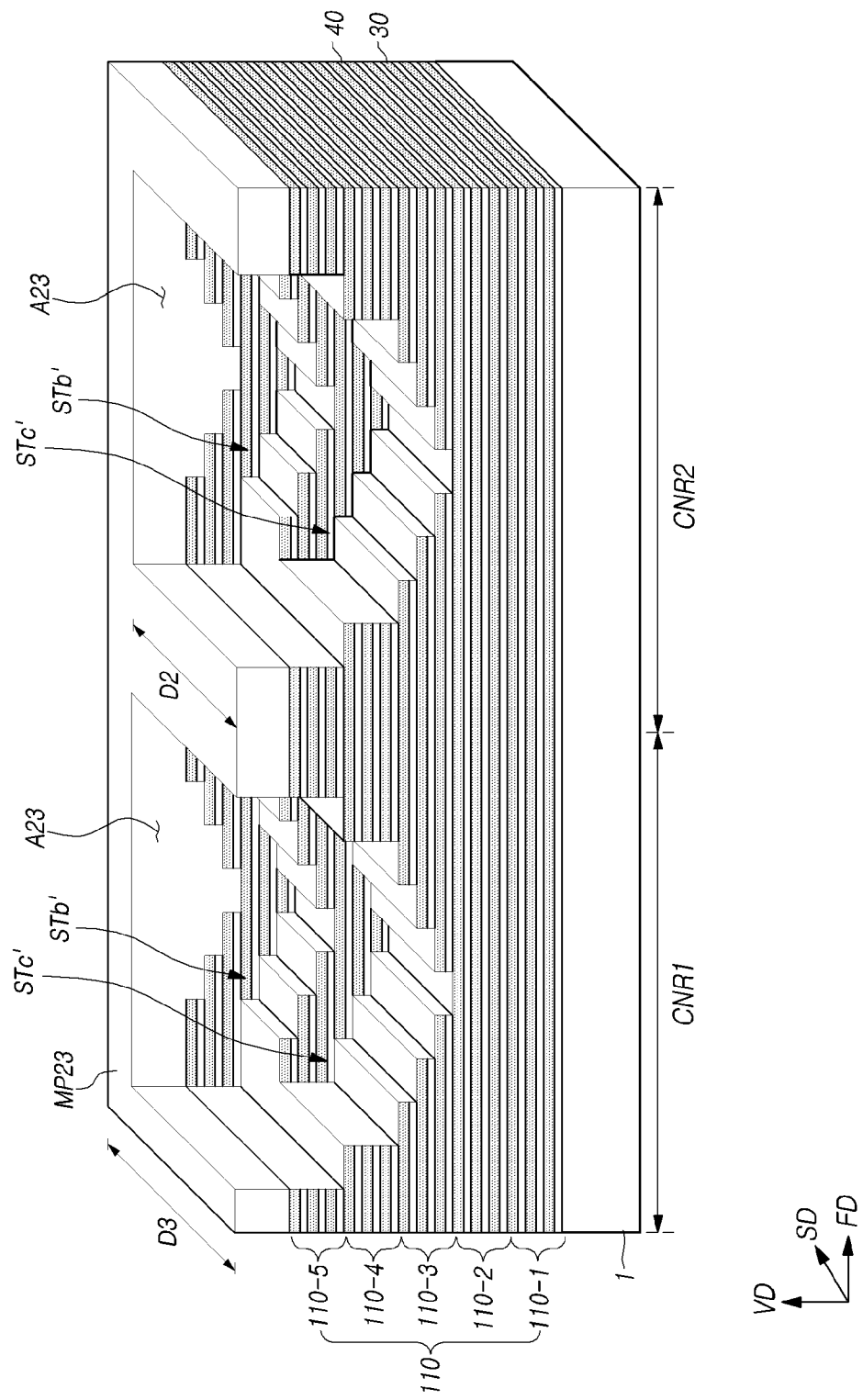
FIGS. 12A and 12C are perspective views illustrating, by process steps, a three-dimensional memory device in accordance with a further embodiment of the disclosure.

FIGS. 12A to 12C are perspective views illustrating, by process steps, a three-dimensional memory device in accordance with a further embodiment of the disclosure.

As described above with reference to FIGS. 10A and 10B, a multi-layered stack 110 may be formed by stacking a plurality of thin film stacks 110-1 to 110-5 on a substrate 1, and staircase structures STa' and STa" may be formed in a first coupling region CNR1 and a second coupling region CNR2, respectively, of a fifth thin film stack 110-5 by alternately repeating a first etching process using a first mask MP11 as an etch mask and a trimming process for the first mask MP11.

Referring to FIG. 12A, a second mask MP22 may be formed with openings A22 that expose portions of the multi-layered stack 110 in the first coupling region CNR1 and the second coupling region CNR2. The width of each of the openings A22 in the second direction SD may have be D1, which may be substantially the same as the third width W13 described above with reference to FIG. 11.

A second etching process of etching the multi-layered stack 110 to a second etching depth using the second mask MP22 as an etch mask may be performed. The second etching depth may same as the thickness of one thin film stack (e.g., one of 110-1 to 110-4). For example, when one thin film stack (e.g., one of 110-1 to 110-4) is configured by three first material layers 30 and three second material layers 40, three first material layers 30 and three second material layers 40 may be etched by the second etching process.

Accordingly, staircase structures STb' may be formed in the first coupling region CNR1 and the second coupling region CNR2, respectively, of the fourth thin film stack 110-4. The second mask MP22 may be formed of a photoresist. The second mask MP22 remaining after the second etching process may be removed through a strip process.

Referring to FIG. 12B, a third mask MP23 may be formed with openings A23, which expose portions of the first coupling region CNR1 and the second coupling region CNR2, respectively, of the multi-layered stack 110.

The width of each of the openings A23 in the second direction SD may be D2. A difference between widths D2 and D1 may be substantially the same as the second width W12 described above with reference to FIG. 11. Furthermore, a difference between a width D3 of the multi-layered stack 110 and width D2 may be substantially the same as the first width W11 described above with reference to FIG. 11. The third width W13 is larger than the second width W12, and the second width W12 is larger than the first width W11 as described above with reference to FIG. 11. Therefore, D1 is larger than the difference between widths D2 and D1, and the difference between widths D2 and D1 is larger than the difference between widths D3 and D2.

A third etching process of etching the multi-layered stack 110 to a third etching depth using the third mask MP23 as an etch mask may be performed. The third etching depth may be the same as the second etching depth.

Accordingly, staircase structures STb' may be formed in the first coupling region CNR1 and the second coupling region CNR2, respectively, of the fourth thin film stack 110-4, and staircase structures STc' may be formed in the first coupling region CNR1 and the second coupling region CNR2, respectively, of the third thin film stack 110-3.

The third mask MP23 may be formed of a photoresist. The third mask MP23 remaining after the third etching process may be removed through a strip process.

Referring to FIG. 12C, a fourth mask MP24 may be formed with an opening A24 that exposes a portion of the second coupling region CNR2 of the multi-layered stack 110. The width of the opening A24 in the second direction SD may be D2.

A fourth etching process of etching the multi-layered stack 110 to a fourth etching depth using the fourth mask MP24 as an etch mask may be performed. The fourth etching depth may correspond to two times the thickness of one thin film stack (e.g., one of 110-1 to 110-5). When the one thin film stack is configured by three first material layers 30 and three second material layers 40, six first material layers 30 and six second material layers 40 may be etched by the fourth etching process.

Accordingly, a staircase structure STd' may be formed in the second coupling region CNR2 of the second thin film stack 110-2, and a staircase structure STe' may be formed in the second coupling region CNR2 of the first thin film stack 110-1.

The fourth mask MP24 may be formed by a photoresist. The fourth mask MP24 that remains after the fourth etching process may be removed through a strip process.

Figure 13:
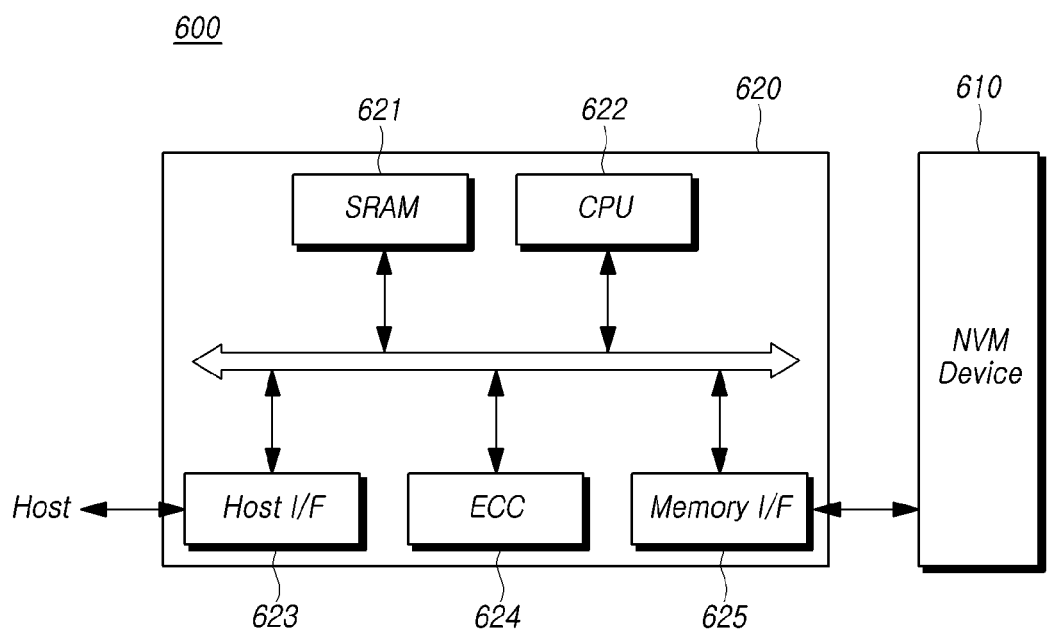
FIG. 13 is a block diagram schematically illustrating a memory system including a semiconductor device in accordance with an embodiment of the disclosure.

FIG. 13 is a block diagram schematically illustrating a memory system including a semiconductor device in accordance with an embodiment of the disclosure.

Referring to FIG. 13, a memory system 600 in accordance with an embodiment may include a nonvolatile memory device (NVM Device) 610 and a memory controller 620.

The nonvolatile memory device (NVM Device) 610 may be constituted by a three dimensional memory device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host, which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device (NVM Device) 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 14:
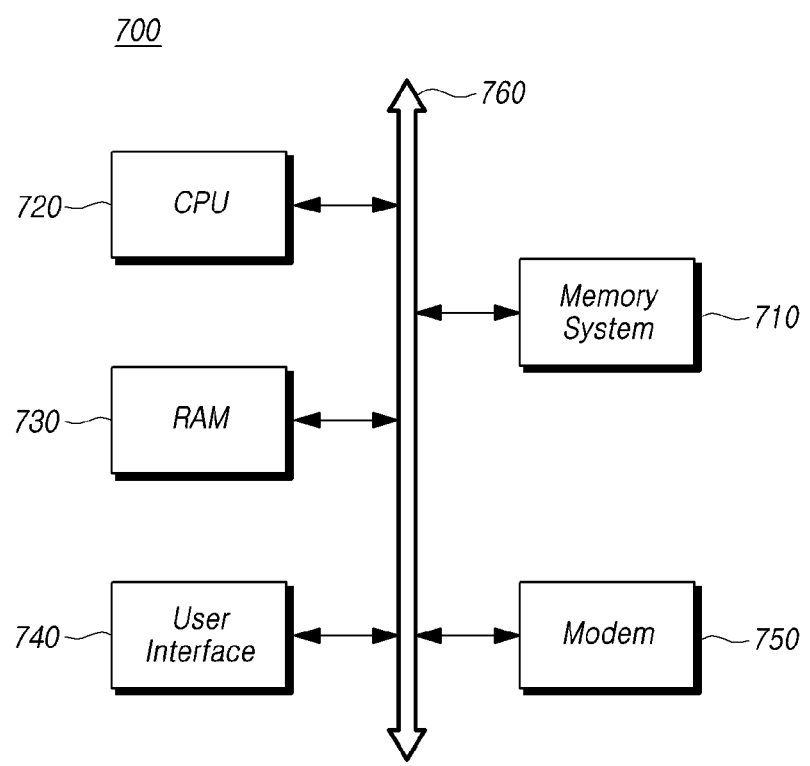
FIG. 14 is a block diagram schematically illustrating a computing system including a three-dimensional memory device in accordance with an embodiment of the disclosure.

FIG. 14 is a block diagram schematically illustrating a computing system including a semiconductor device in accordance with an embodiment of the disclosure.

Referring to FIG. 14, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A method for manufacturing a three-dimensional memory device, comprising:
   forming a multi-layered stack by stacking, in a vertical direction on a substrate, a plurality of thin film stacks each including a plurality of first material layers that are alternately stacked with a plurality of second material layers; and
   forming a plurality of staircase structures in the plurality of thin film stacks such that a staircase structure of an upper thin film stack has a smaller width in a second direction than a staircase structure of a lower thin film stack,
   wherein the substrate includes a plurality of coupling regions that are arranged in a first direction, which together with the second direction forms a plane that is perpendicular to the vertical direction, the second direction is a width direction of the plurality of staircase structures,
   wherein the plurality of staircase structures are formed in the plurality of coupling regions, and,
   wherein the forming of the plurality of staircase structures comprises:
   forming, on the multi-layered stack, a hard mask pattern having a plurality of openings that correspond to the plurality of coupling regions;
   forming staircase structures in an uppermost thin film stack exposed by the plurality of openings;

forming a first mask that exposes at least one of the staircase structures in the uppermost thin film stack; and forming a staircase structure in a thin film stack under the uppermost thin film stack by etching the multi-layered stack using the hard mask pattern and the first mask as an etch mask.

2. The method according to claim 1, wherein the forming of the staircase structures in the uppermost thin film stack comprises:

forming a second mask that exposes, by a first width, portions of the uppermost thin film stack common to the plurality of openings, which are arranged in the first direction; and repeatedly performing a process of etching the uppermost thin film stack by a first etching depth using the hard mask pattern and the second mask as an etch mask and a trimming process of reducing a width of the second mask, wherein the first etching depth is substantially same as the sum of a thickness of one of the plurality of first material layers and a thickness of one of the plurality of second material layers.

3. The method according to claim 1, wherein the plurality of openings have different widths that increase or decrease according to units of group.

4. A method for manufacturing a three-dimensional memory device, comprising:

forming a multi-layered stack by stacking, in a vertical direction on a substrate, a plurality of thin film stacks each including a plurality of first material layers that are alternately stacked with a plurality of second material layers; and forming a plurality of staircase structures in the plurality of thin film stacks such that a staircase structure of an upper thin film stack has a smaller width in a second direction than a staircase structure of a lower thin film stack, wherein the substrate includes a first coupling region and a second coupling region, which are arranged in a first direction as an extending direction of the plurality of thin film stacks, wherein the plurality of staircase structures formed in the first coupling region are arranged, in a top view, in the second direction perpendicular to the first direction and the vertical direction, wherein the plurality of staircase structures in the second coupling region are arranged, in a top view, in the second direction, and, wherein the forming of the plurality of staircase structures comprises:

forming staircase structures in the first coupling region and the second coupling region, respectively, of the uppermost thin film stack by repeating a first patterning process on the uppermost thin film stack; and forming staircase structures in lower thin film stacks positioned under the uppermost thin film stack, by reproducing the staircase structures of the uppermost thin film stack in the lower thin film stacks.

5. The method according to claim 4, wherein the first patterning process comprises:

forming a first mask having first openings that expose the first coupling region and the second coupling region, respectively, by a first width in the first direction; and repeatedly performing a process of etching the uppermost thin film stack by a first etching depth using the first mask as an etch mask and a trimming process of widening a width of each of the first openings in the first direction, wherein the first etching depth is substantially same as the sum of a thickness of one of the plurality of first material layers and a thickness of one of the plurality of second material layers.

6. The method according to claim 5, wherein the forming of the staircase structures in the lower thin film stacks comprises:

etching the multi-layered stack by a second etching depth using, as an etch mask, a second mask having second openings that expose the first coupling region and the second coupling region, respectively, of the multi-layered stack by a first width in the second direction;

etching the multi-layered stack by a third etching depth using, as an etch mask, a third mask having a third opening that exposes the second coupling region by a second width larger than the first width in the second direction; and etching the multi-layered stack by a fourth etching depth using, as an etch mask, a fourth mask having fourth openings that expose the first coupling region and the second coupling region, respectively, by the second width in the second direction, wherein the first width is larger than a difference between the second width and the first width, and wherein the difference between the second width and the first width is larger than a difference between a width of the multi-layered stack and the second width.

7. The method according to claim 6, wherein the second etching depth is twice the thickness of a thin film stack.

8. The method according to claim 5, wherein the forming of the staircase structures in the lower thin film stacks comprises:

etching the multi-layered stack by a second etching depth using, as an etch mask, a second mask having second openings that expose the first coupling region and the second coupling region, respectively, by a first width in the second direction;

etching the multi-layered stack by a third etching depth using, as an etch mask, a third mask having third openings that expose the first coupling region and the second coupling region, respectively, by a second width larger than the first width in the second direction; and etching the multi-layered stack by a fourth etching depth using, as an etch mask, a fourth mask having a fourth opening that exposes the second coupling region by the second width in the second direction, wherein the first width is larger than a difference between the second width and the first width, and wherein the difference between the second width and the first width is larger than a difference between a width of the multi-layered stack and the second width.

9. The method according to claim 8, wherein the second etching depth, the third etching depth and the fourth etching depth are each the thickness of a thin film stack.

10. The method according to claim 9, wherein the plurality of staircase structures formed in the first coupling region are disposed in adjacent thin film stacks, and the plurality of staircase structures formed in the second coupling region are not arranged in adjacent thin film stacks.

* * * * *